United States Patent
Shimanuki et al.

(10) Patent No.: US 7,339,261 B2
(45) Date of Patent: Mar. 4, 2008

(54) SEMICONDUCTOR DEVICE

(75) Inventors: Yoshihiko Shimanuki, Nanyo (JP); Koji Tsuchiya, Kaminoyama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/653,402

(22) Filed: Jan. 16, 2007

(65) Prior Publication Data

US 2007/0108563 A1    May 17, 2007

Related U.S. Application Data

(62) Division of application No. 11/038,070, filed on Jan. 21, 2005, now Pat. No. 7,176,557.

(30) Foreign Application Priority Data

Mar. 23, 2004    (JP) .............................. 2004-084170

(51) Int. Cl.
*H01L 23/495* (2006.01)
(52) U.S. Cl. ...................... 257/670; 257/673; 257/735; 257/E23.043; 257/E23.046; 257/E23.05; 438/123
(58) Field of Classification Search ................ 257/670, 257/E23.043
See application file for complete search history.

(56) References Cited

U.S. PATENT DOCUMENTS 5,936,837 A    8/1999    Scribner et al. ............ 361/704
6,909,179 B2 *  6/2005    Tanaka et al. ............... 257/734
2001/0015481 A1  8/2001    Miyaki et al. ............... 257/673

FOREIGN PATENT DOCUMENTS

JP    2002-134676    5/2002

* cited by examiner

*Primary Examiner*—Tu-Tu V. Ho
(74) *Attorney, Agent, or Firm*—Miles & Stockbridge P.C.

(57) ABSTRACT

A semiconductor device which permits reduction in the number of pins and in size thereof is provided. The semiconductor device comprises a sealing body formed of an insulating resin, the sealing body having an upper surface, a lower surface opposite to the upper surface, and side faces which connect the upper and lower surfaces with each other; an electrically conductive tab sealed within the sealing body; tab suspending leads contiguous to the tab and partially exposed to the lower surface and the side faces of the sealing body; a semiconductor chip fixed to a lower surface of the tab; a plurality of electrically conductive leads, the electrically conductive leads each having an inner end portion positioned within the sealing body, an outer end portion exposed to the lower surface and a side face of the sealing body, and a projecting portion projecting into the sealing body from a side face of each of the electrically conductive leads; a projecting portion projecting from a side face of each of the tab suspending leads and positioned within the sealing body; and electrically conductive wires positioned within the sealing body and connecting electrodes formed on a lower surface of the semiconductor chip with the projecting portions of the electrically conductive leads and the tab suspending leads.

13 Claims, 22 Drawing Sheets

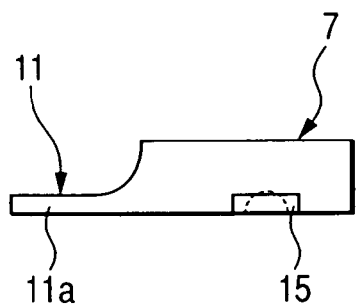
FIG. 6(a)
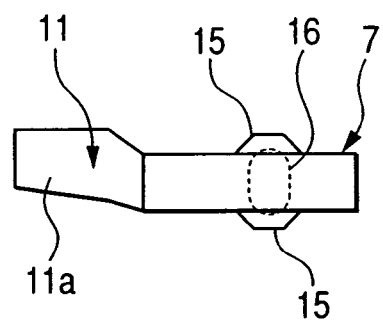
FIG. 6(b)
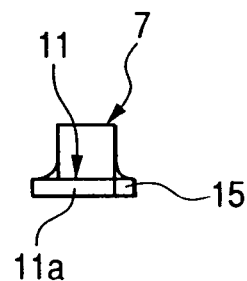
FIG. 6(c)
FIG. 7
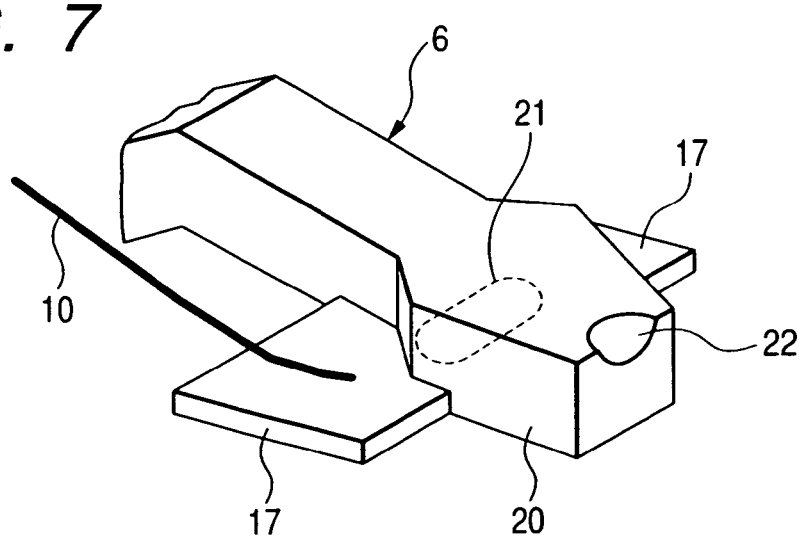

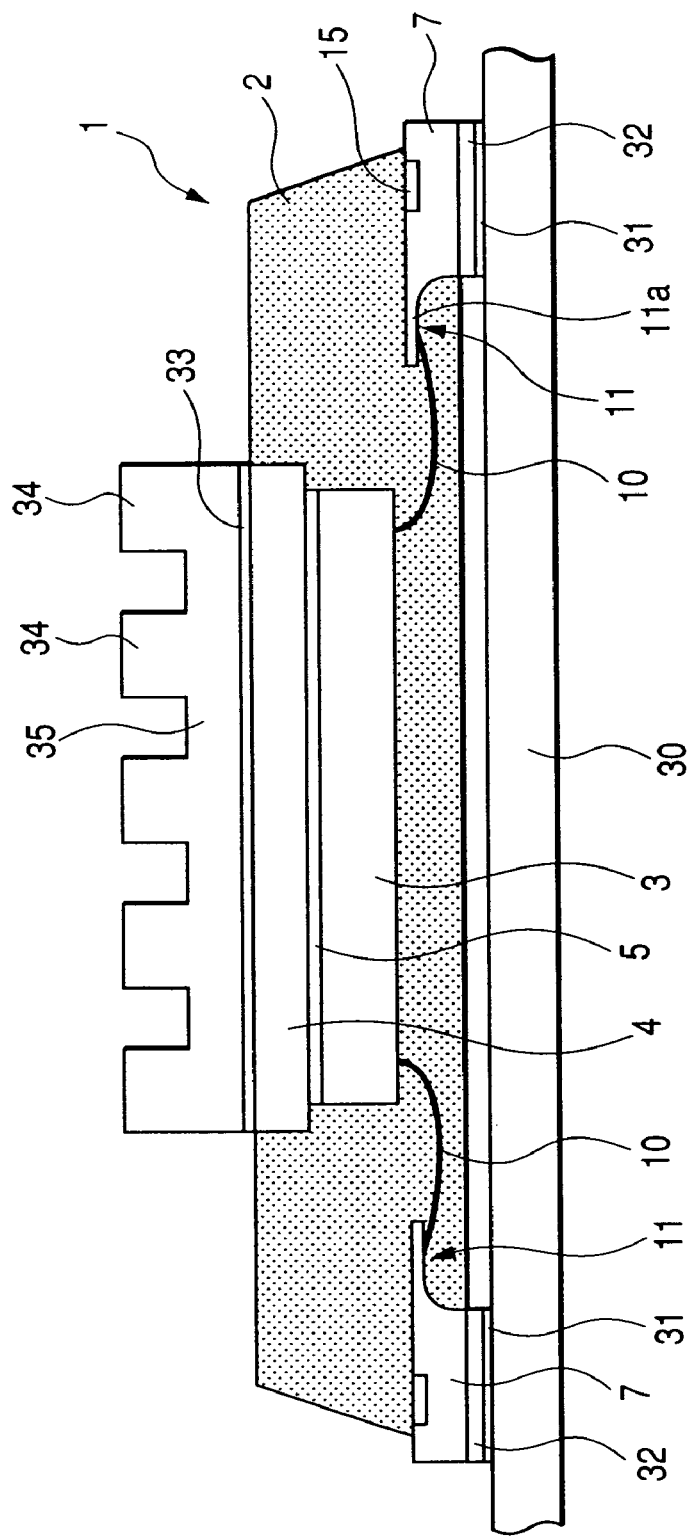

FIG. 33
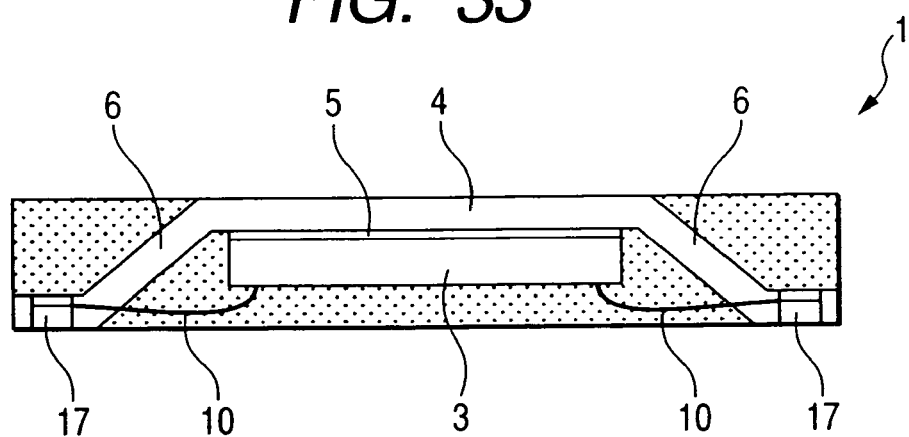
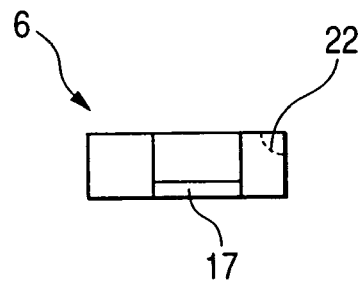
FIG. 34(a)
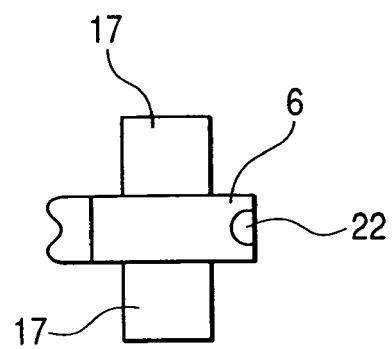
FIG. 34(b)
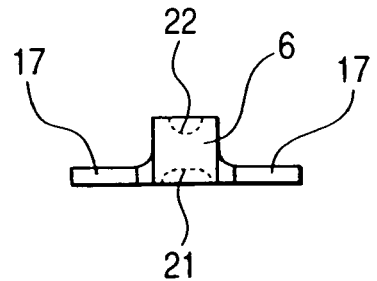
FIG. 34(c)

SEMICONDUCTOR DEVICE

CROSS-REFERENCE TO RELATED APPLICATION

This application is a division of application Ser. No. 11/038,070 filed Jan. 21, 2005, now U.S. Pat. No. 7,176,557.

The present application claims priority from Japanese patent application No. 2004-084170 filed on Mar. 23, 2004, the content of which is hereby incorporated by reference into this application.

BACKGROUND OF THE INVENTION

The present invention relates to a semiconductor device and a method of manufacturing the same. Particularly, the present invention is concerned with a technique applicable effectively to the manufacture of a semiconductor device (non-leaded semiconductor device) such as SON (Small Outline Non-leaded package) and QFN (Quad Flat Non-leaded package) wherein external electrode terminals are exposed to a mounting surface side without intentional projection thereof on a side of a package.

A lead frame is used in manufacturing a resin-sealed type semiconductor device. The lead frame is fabricated by patterning a metallic plate into a desired pattern by punching with use of a precision press or by etching. The lead frame has a support portion called tab or die pad for fixing a semiconductor element (semiconductor chip) thereto and plural leads whose front ends (inner ends) face around the support portion. The tab is supported by tab suspending leads which extend from a frame portion of the lead frame.

In manufacturing the resin-sealed type semiconductor device with use of such a lead frame, a semiconductor chip is fixed to the tab in the lead frame and electrodes on the semiconductor chip and front ends of the leads are connected with each other through electrically conductive wires, thereafter inner end sides of the leads, including the wires and the semiconductor chip, are sealed with an insulating resin to form a sealing body (package), and then unnecessary lead frame portions are cut off. Where required, the leads projecting from the sealing body are subjected to a forming work.

On the other hand, as a resin-sealed type semiconductor device manufactured by using a lead frame there is known a semiconductor device (non-leaded semiconductor device) wherein a single-side molding is performed for one surface of a lead frame to form a package and leads as external electrode terminals are exposed to one surface of the package without intentional projection thereof from the peripheral surface of the package. As semiconductor devices of this type there are known SON wherein leads are exposed to both side edges of one surface of a package and QFN wherein leads are exposed to four sides of a quadrangular package. There also is known a semiconductor device wherein an upper surface of a tab is exposed to an upper surface of a sealing body (see, for example, Patent Literature 1).

In Patent Literature 1 is disclosed a semiconductor package wherein lower surfaces of leads are exposed to the peripheral portion of a lower surface of a resin capsule (sealing body). According to the structure disclosed therein, lower surfaces of lead inner ends are half-etched and the half-etched surfaces and electrodes on a lower surface of a semiconductor chip are connected with each other through wires. Further, electrodes on the semiconductor chip and pads are electrically connected with each other through ground wires.

[Patent Literature 1]

Japanese Unexamined Patent Publication No. 2002-134676

SUMMARY OF THE INVENTION

In semiconductor devices, a further increase in the number of external electrode terminals (pins) is made with improvement of functions, etc. Besides, a further reduction of size is required of semiconductor devices because various electronic devices are mounted thereon.

In an IC (Integrated Circuit), ground terminals are disposed at plural positions for stabilizing the supply potential such as ground terminals on the circuit. An increase in the number of ground terminals leads to an increase in the number of pins, resulting in an increase in size of the semiconductor device. As to a semiconductor device wherein a tab with a semiconductor chip mounted thereon is set at a ground potential, there is a method wherein wires connected to ground electrodes of the semiconductor chip are connected to a tab portion positioned outside the semiconductor chip to decrease the number of ground terminals. In this case, however, the tab becomes larger in size and so does the semiconductor device.

It is an object of the present invention to provide a semiconductor device capable of being reduced in size even if the number of supply potential electrodes of a semiconductor chip is large, as well as a method of manufacturing the same.

It is another object of the present invention to provide a non-leaded semiconductor device capable of dissipating heat from an upper surface side of a sealing body, as well as a method of manufacturing the same.

The above and other objects and novel features of the present invention will become apparent from the following description and the accompanying drawings.

Typical modes of the present invention as disclosed herein will be outlined below.

(1) A semiconductor device comprising a sealing body formed of an insulating resin, the sealing body having an upper surface, a lower surface opposite to the upper surface, and side faces which connect the upper and lower surfaces with each other; an electrically conductive tab sealed within the sealing body; tab suspending leads contiguous to the tab and partially exposed to the lower surface and the side faces of the sealing body; a semiconductor chip fixed to a lower surface of the tab; a plurality of electrically conductive leads, the electrically conductive leads each having an inner end portion positioned within the sealing body, an outer end portion exposed to the lower surface and a side face of the sealing body, and a projecting portion projecting into the sealing body from a side face of each of the electrically conductive leads; a projecting portion projecting from a side face of each of the tab suspending leads and positioned within the sealing body; and electrically conductive wires positioned within the sealing body and connecting electrodes formed on a lower surface of the semiconductor chip with the projecting portions of the electrically conductive leads and the tab suspending leads.

Lower surfaces of the projecting portions of the leads and the tab suspending leads to which the wires are connected are etched off by a predetermined thickness and become thinner, and the wires are connected to the thinner lower surfaces. The electrodes of the semiconductor chip which are connected to the tab suspending leads through the wires are supply potential electrodes. The tab suspending leads are bent halfway and an upper surface of the tab is exposed to the upper surface of the sealing body. The upper surface of the tab exposed to the upper surface of the sealing body is a surface having been subjected to an adhered resin removing treatment by polishing.

The semiconductor device constructed as above is manufactured by a method comprising the steps of:

forming a lead frame, the lead frame comprising a plurality of leads each having a projecting portion projecting from a side face thereof, a tab for fixing a semiconductor chip, a plurality of tab suspending leads contiguous to the tab and each having a projecting portion projecting from a side face thereof, and a frame portion for connecting the leads and the tab suspending leads with one another, the leads, the tab, the tab suspending leads and the frame portion each having a first surface and a second surface opposite to the first surface, the projecting portions of the leads and the tab suspending leads having wire connecting surfaces at least partially on the second surface, the wire connecting surfaces being positioned closer to the first surface side than the other portion;

fixing a semiconductor element to the second surface of the tab;

electrically connecting electrodes of the semiconductor element with the wire connecting surfaces of the leads and the tab suspending leads on the second surface side through electrically conductive wires;

sealing the semiconductor element, the wires, the leads and the projecting portions of the leads and the tab suspending leads with an insulating resin so that the second surfaces of the leads and the tab suspending leads are exposed from the insulating resin, to form a sealing body; and cutting off the leads and the tab suspending leads from the frame portion.

In the lead frame forming step, surfaces of the leads and the tab suspending leads corresponding to the projecting portions thereof are etched by a predetermined thickness to form wire connecting portions. In connecting the wires, ground potential electrodes of the semiconductor chip and the projecting portions of the tab suspending leads are connected with each other through the wires. After the formation of the sealing body, the resin adhered to the surface of the tab exposed to the surface of the sealing body is removed by polishing.

(2) In the above construction (1), the projecting portions project from both side faces of the leads and the tab suspending leads.

In manufacturing such a semiconductor device, the projecting portions are formed on both side faces of the leads at the time of forming the lead frame.

(3) In the above construction (1), the projecting portions of the leads project from both side faces of the leads. The projecting portions of adjacent leads are arranged so as to be dislocated from each other in the extending direction of the leads and so as not to be arranged in a row in a direction intersecting the leads. In the adjacent leads, the height of a loop described by the wire which connects each projecting portion in one lead with the associated electrode on the semiconductor chip and that of the wire which connects each projecting potion in the other lead with the associated electrode on the semiconductor chip are different from each other so as not to contact each other.

In manufacturing such a semiconductor device, the projecting portions are formed on both side faces of each lead at the time of forming the lead frame. In this case, in the adjacent leads, the projecting portions are dislocated from each other in the extending direction of the leads so as not to be arranged in a row in a direction intersecting the leads. Further, the wire connection is performed so that, in adjacent leads, a loop of the wire which connects each projecting portion in one lead with the associated electrode on the semiconductor chip and that of the wire which connects each projecting portion in the other lead with the associated electrode on the semiconductor chip are of different heights to avoid mutual contact.

The following is a brief description of effects obtained by the typical modes of the present invention as disclosed herein.

According to the above means (1), (a) since the projecting portions formed on side faces of the tab suspending leads contiguous to the tab set at ground potential and the ground potential electrodes on the semiconductor chip are connected with each other through wires, it is possible to decrease the number of leads provided as ground potential leads and hence possible to attain the reduction in size of the semiconductor device.

(b) Since the projecting portions formed on side faces of the tab suspending leads contiguous to the tab set at ground potential and the ground potential electrodes of the semiconductor chip are connected with each other through wires and the wires are not connected to the tab portion deviated from the semiconductor chip, it is possible to attain the reduction in size of the tab and of the semiconductor device.

(c) Since projecting portions formed on side faces of the leads are used as wire connecting portions, the leads after the sealing become difficult to come off from the sealing body and therefore the reliability of the semiconductor device is improved.

(d) Since the upper surface of the tab with the semiconductor chip fixed thereto is exposed from the upper surface of the sealing body, a heat dissipating member can be attached to the tab and it is possible to provide a semiconductor device having a high heat dissipating performance. Since the resin adhered to the exposed tab surface is removed by polishing, there no longer is present any substance resistive to the dissipation of heat, whereby the heat dissipating performance is further improved.

According to the above means (2), since the projecting portions are formed on both sides of each of the leads and the tab suspending leads, the number of wire connections increases and the number of pins can be decreased.

According to the above means (3), the projecting portions of the leads are arranged in such a manner that the projecting portions between adjacent leads are dislocated from each other in the extending direction of the leads and so as not to be arranged in a row in a direction intersecting the leads. Further, in adjacent leads, the height of a loop described by the wire which connects each projecting portion in one lead and that of a loop described by the wire which connects each projecting portion in the other lead are different from each other to avoid mutual contact. Consequently, the reliability of the semiconductor device becomes high.

BRIEF DESCRIPTION OF THE DRAWINGS

FIG. 1 is a schematic bottom view wherein leads, wires and a semiconductor chip of a semiconductor device according to a first embodiment of the present invention are seen through;

FIGS. 6(a), 6(b) and 6(c) are diagrams showing an inverted state of the wire-connected lead portion;

FIG. 7 is a schematic perspective view showing an inverted state of a wire-connected tab suspending lead portion in the semiconductor device;

FIG. 9 is a schematic sectional view showing a packaged state of the semiconductor device;

FIG. 14 is a schematic bottom view showing a state in which leads, wires and a semiconductor chip of a semiconductor device according to a second embodiment of the present invention are seen through;

FIG. 17 is a schematic bottom view showing a state in which leads, wires and a semiconductor chip of a semiconductor device according to a third embodiment of the present invention are seen through;

FIG. 24 is a schematic bottom view showing a state in which leads, wires and a semiconductor chip of a semiconductor device according to a fourth embodiment of the present invention are seen through;

FIG. 27 is a schematic bottom view showing a state in which leads, wires and a semiconductor chip of a semiconductor device according to a fifth embodiment of the present invention are seen through;

FIG. 33 is a schematic sectional view of a semiconductor device according to a modification of the fifth embodiment as seen in an extending direction of a tab suspending lead;

FIGS. 34(a), 34(b) and 34(c) are diagrams showing an inverted state of a tab suspending lead having wire-connecting projecting portions on both sides thereof in the semiconductor device according to the modification of the fifth embodiment.

DETAILED DESCRIPTION OF PREFERRED EMBODIMENTS

Figure 1:
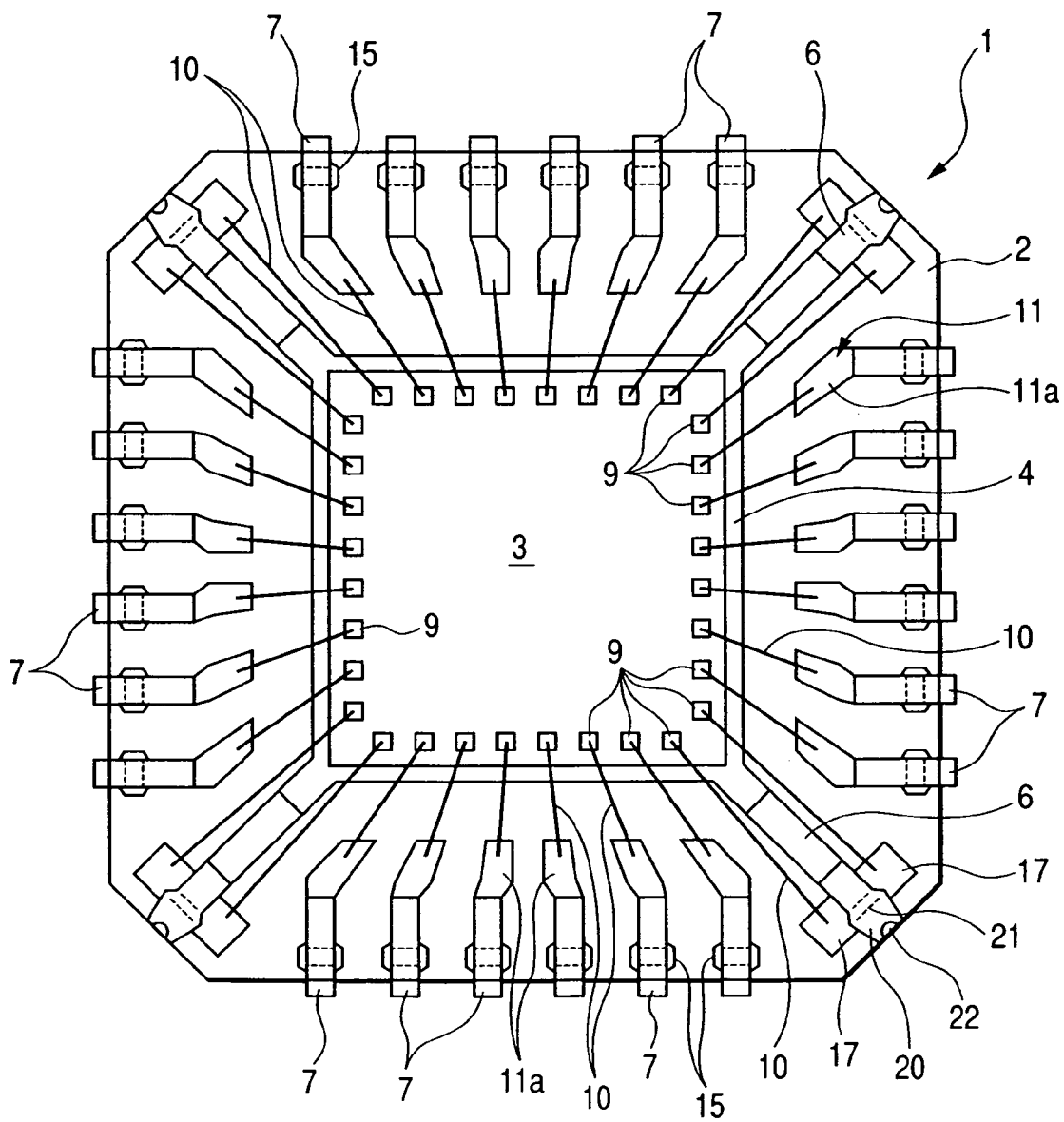

Embodiments of the present invention will be described in detail hereinunder with reference to the accompanying drawings. In all of the drawings for explaining the embodiments, portions having the same functions are identified by the same reference numerals, and repeated explanations thereof will be omitted.

First Embodiment

FIGS. 1 to 13 illustrate a semiconductor device according to a first embodiment of the present invention, of which FIGS. 1 to 8 illustrate the structure of the semiconductor device, FIG. 9 illustrates a packaged state of the semiconductor device, and FIGS. 10 to 13 illustrate a method of manufacturing the semiconductor device.

In this first embodiment the present invention is applied to a non-leaded semiconductor device (QFN) wherein an upper surface of a tab is exposed to an upper surface of a quadrangular sealing body and lower surfaces of leads are exposed to the four sides of the lower surface of the sealing body.

As shown in FIGS. 1 to 4, the QFN type semiconductor device, indicated at 1, has a flat and quadrangular (square) sealing body (package) 2 formed of an insulating resin. The four corners of the sealing body 2 are chamfered to form slant faces 2a (see FIGS. 2 to 4). A quadrangular semiconductor chip (semiconductor element) 3 is embedded in the interior of the sealing body 2. The semiconductor chip 3 is fixed to a lower surface of a quadrangular tab 4 through an adhesive 5 (see FIGS. 3 and 4).

Thin tab suspending leads 6 are provided respectively at the four corners of the tab 4. The tab suspending leads 6 extend in diagonal directions of the quadrangular tab 4 and their outer ends are exposed to the slant faces 2a of the sealing body 2. This is because the tab suspending leads 6 projecting from the slant faces 2a of the sealing body are cut at their projecting positions from the slant faces 2a in manufacturing the semiconductor device 1.

The tab 4 is a little larger than the semiconductor chip 3. The four sides of the tab 4 extend outside the four sides of the semiconductor chip 3 and the four sides of the sealing body extent outside and along the four sides of the tab 4.

Figure 3:
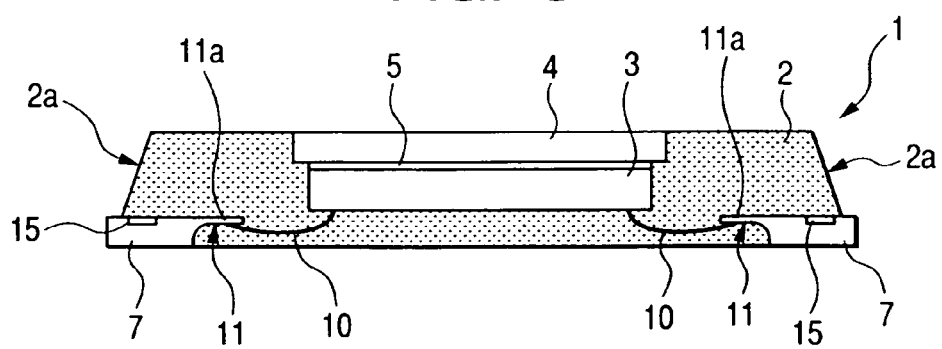
FIG. 3 is a schematic sectional view substantially taken along line A-A in FIG. 2.
Figure 4:
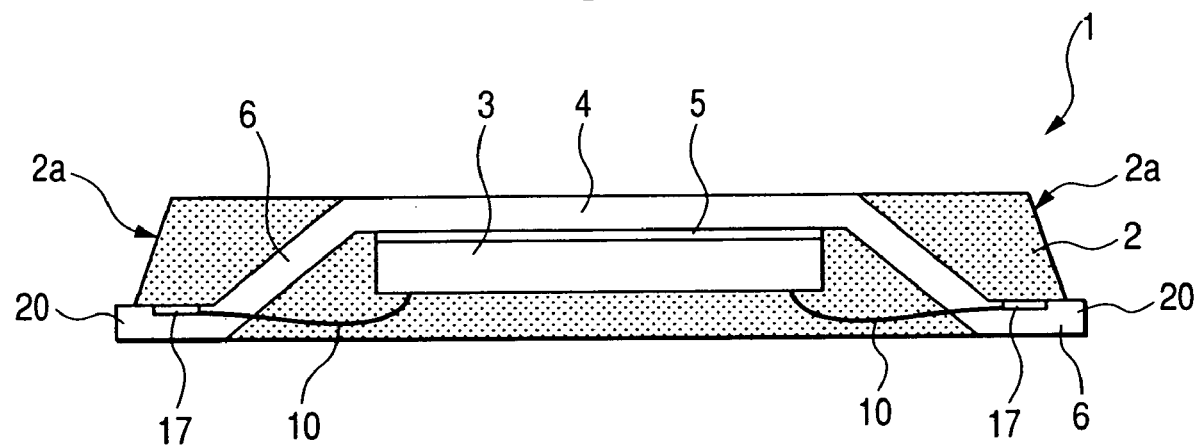
FIG. 4 is a schematic sectional view substantially taken along line B-B in FIG. 2.

As shown in FIGS. 3 and 4, a lower surface of the sealing body 2 serves as a mounting surface at the time of mounting the semiconductor device 1 onto a mounting substrate. Lower surfaces of the tab suspending leads 6 contiguous to the tab 4 and of the leads 7 are exposed to the mounting surface of the sealing body, or package, 2, as shown in FIGS. 3 and 4. The portions of the leas 7 and the tab suspending leads 6 exposed to the lower surface of the sealing body 2 serve as mounting surfaces at the time of mounting the semiconductor device 1 to the mounting substrate. The tab suspending leads 6 are contiguous on their inner end sides to the tab 4 whose upper surface is exposed to an upper surface of the sealing body 2, while their outer end portions are exposed to the lower surface of the sealing body 2. Thus, intermediate portions of the tab suspending leads 6 are bent in one step, as shown in FIG. 4.

For the convenience of explanation, upper surfaces of the tab 4, tab suspending leads 6, leads 7 and sealing body 2 are designated first surfaces and lower surfaces thereof are designated second surfaces. As will be described later, the semiconductor device 1 is manufactured using a lead frame, and the tab 4, tab suspending leads 6 and leads 7 are fabricated by cutting predetermined portions of the one lead frame. The lead frame is formed by etching a single metallic plate into a predetermined lead pattern by punching with use of a press. The semiconductor device 1 is manufactured from the lead pattern. In this first embodiment, the lead frame is formed by a copper plate of 0.2 mm in thickness for example.

Electrodes (electrode pads) 9 on the semiconductor chip 3 and the leads 7 are electrically connected with each other through electrically conductive wires 10. A back electrode of the semiconductor chip 3 is connected to the lower surface (second surface) of the tab 4 through the adhesive 5. Thus, plural electrodes (electrode pads) 9 are positioned on a lower surface of the semiconductor chip 3 (see FIG. 1). Therefore, wires are connected to the electrodes 9 in the following manner. The lower surfaces (second surfaces) of the leads 7 are inverted into upper surfaces and in this state wiring bonding is performed between the electrodes 9 on the semiconductor chip 3 and the leads 7 with use of a conventional wire bonding apparatus. That the wires are projected from or exposed to the lower surface (second surface) of the sealing body 2 is not desirable in point of moisture resistance and appearance. Therefore, front end portions of the leads 7 are etched a predetermined depth from one surfaces (second surfaces) thereof and wires are connected to the etched surfaces (second surfaces) as wire connecting surfaces. For example, if the leads 7 of a lead frame 0.2 mm thick are etched a predetermined depth from the second surface side and the height (wire loop height) of each connected wire is made lower than the etched depth, it is possible to prevent exposure of the wires from the lower surface (second surface) of the sealing body. Though not shown, a plating film is formed on each wire connecting surface in order to improve the wire connectability. For example, the plating film is formed by Au, Ag, or Pd.

Figure 5:
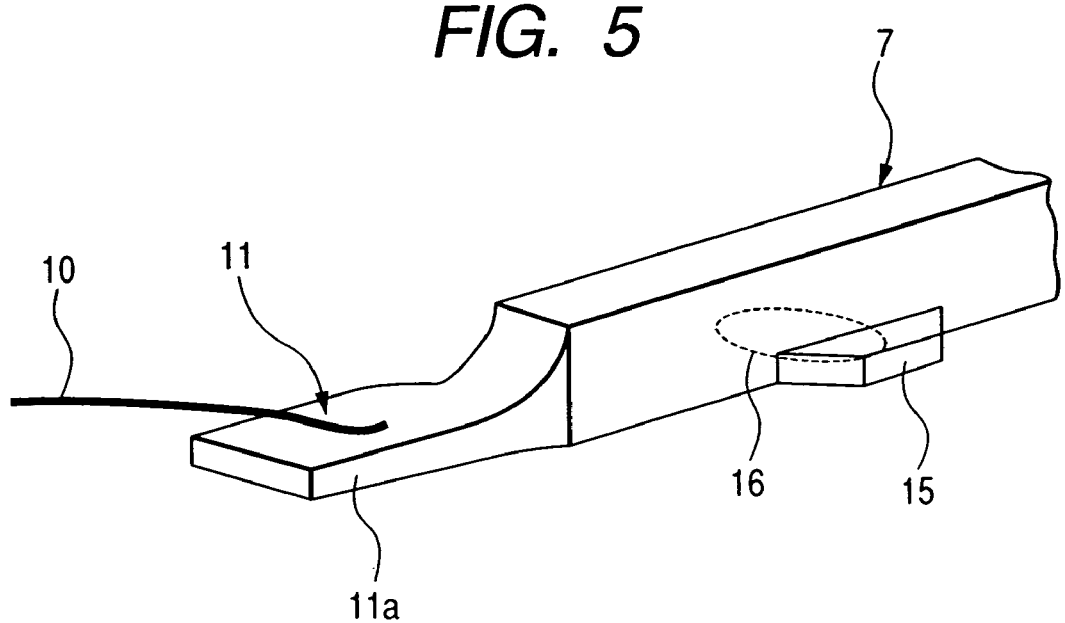
FIG. 5 is a schematic perspective view showing an inverted state of a wire-connected lead portion in the semiconductor device.

FIGS. 5, 6(a), 6(b) and 6(c) show a lead 7, of which FIG. 5 is a perspective view showing a part of a lead 7 in an inverted state to which a wire 10 is connected, FIG. 6(a) is a front view of the lead 7, FIG. 6(b) is a plan view thereof, and FIG. 6(c) is a side view thereof. In FIG. 5, the upper surface serves as the second surface. A part of a front end portion of the lead 7 forms a wire connecting portion 11a which is bent and projects on one side. The wire connecting portion 11a is etched thin from the second surface side. A depressed surface by the etching forms a wire connecting surface 11. The wire 10 is connected to the wire connecting surface 11. Since the etching is performed from one surface side, the first surface portion opposite to the wire connecting surface 11 of the lead 7 and the first surface of the lead 7 are flush with each other. Since the front end portion of the lead 7 is bent to and projects to one side, it bites into the resin which forms the sealing body 2, so that the lead does not fall off from the sealing body 2.

In this first embodiment, moreover, for preventing dislodgment of each lead 7 from the sealing body 2, thin fixed pieces 15 projecting on both sides of the lead 7 are provided, and a depression 16 is formed in the first surface. The fixed pieces 15 bite into the sealing body 2 and the resin gets into the depression 16, so that the lead 7 becomes difficult to fall off from the sealing body 2.

Figure 8A:
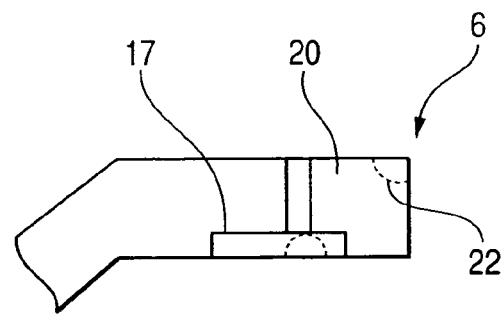
FIGS. 8(a), 8(b) and 8(c) are diagrams showing an inverted state of the wire-connected tap suspending lead portion.
Figure 8B:
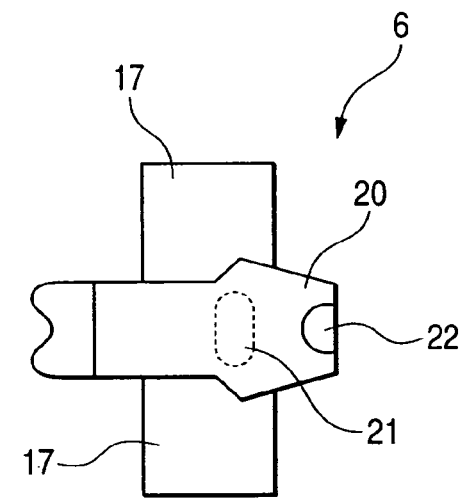
Figure 8C:
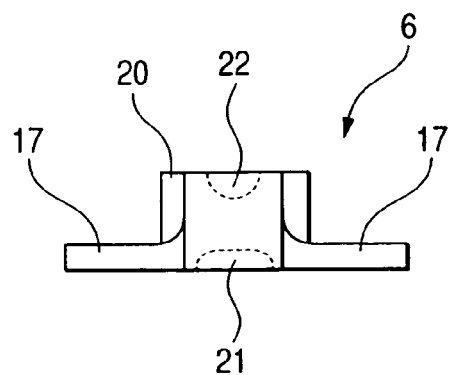

On the other hand, as shown in FIGS. 1, 7 and 8, projecting portions 17 are provided on both sides of each tab suspending lead 6. FIG. 8(a) is a front view of the tab suspending lead 6, FIG. 8(b) is a plan view thereof, and FIG. 8(c) is a side view thereof. As shown in FIG. 7, a partially wide portion 20 is formed at an outer end of the tab suspending lead 6, and projecting portions 17 thinner than the tab suspending lead 6 are formed on both sides of the wide portion 20. The projecting portions 17 are formed by etching the tab suspending lead 6 portion by a predetermined depth from the second surface side of the lead frame. Therefore, the first surfaces of the projecting portions 17 are contiguous to and flush with the first surface of the tab suspending lead 6.

The projecting portions 17 bite into the resin which forms the sealing body 2, so that the tab suspending lead 6 is held firmly within the sealing body 2. Depressions 21 and 22 are formed respectively in the first surface and an outer edge of the wide portion 20 of the tab suspending lead 6. The resin which forms the sealing body 2 gets into the depressions 21 and 22. As a result, the wide portion 20 of the tab suspending lead 6 is held firmly by the resin.

In the semiconductor device 1 of this first embodiment, since the tab 4 is set at the ground potential, the tab suspending lead 6 is also set at the ground potential inevitably. Therefore, the wires 10 connected to the projecting portions 17 of the tab suspending lead 6 are connected to the ground potential electrodes 9 on the semiconductor chip 3. A plating film is formed on the wire connecting surface of each projecting portion 17 of the tab suspending lead 6 in order to improve the wire-connectability. For example, the plating film is formed by Au, Ag, or Pd.

Although in this first embodiment the wire connecting portion 11a having the wire connecting surface 11, the fixed pieces 15 and the projecting portions 17 are formed by etching, they may be formed by coining with use of a press. Pressing, in comparison with etching, is suitable for mass production and can attain the reduction of cost.

Outer ends of the leads 7 are formed by cutting lead portions with a press after formation of the sealing body in manufacturing the semiconductor device 1. The leads 7 are cut at a projection length of about 0.1 mm from the sealing body 2.

A dimensional example in the height direction of the semiconductor device will now be given. The leads 7 and the tab suspending leads 6 are each 0.2 mm thick, the depth of the wire connecting surface formed as a depressed surface by etching is 0.1 mm, the loop height of each wire 10 is about 80 µm, the thickness of the semiconductor chip 3 is about 280 µm, and the thickness of the semiconductor device is about 0.5 to 0.8 mm.

FIG. 9 is a sectional view showing a mounted state of the semiconductor device 1 onto a mounting substrate 30 as a wiring substrate. On one surface of the mounting substrate 30 there are formed electrodes (lands) 31 correspondingly to the leads 7 as external electrode terminals and the tab suspending leads 6. The leads 7 as external electrode terminals and the tab suspending leads 6 in the semiconductor device 1 are superimposed on the lands 31 and are electrically connected to the lands through a bonding material 32 such as solder. A heat dissipating member 35 having heat dissipating fins 34 is fixed through a highly thermoconductive adhesive 33 to the upper surface of the tab 4 exposed to the upper surface of the sealing body 2. With the heat dissipating member 35, the heat generated in the semiconductor chip 3 is dissipated efficiently into the atmosphere and hence the semiconductor device 1 can operate stably.

Next, a method of manufacturing the semiconductor device 1 according to this first embodiment will be described below with reference to FIGS. 10 to 13.

Figure 10:
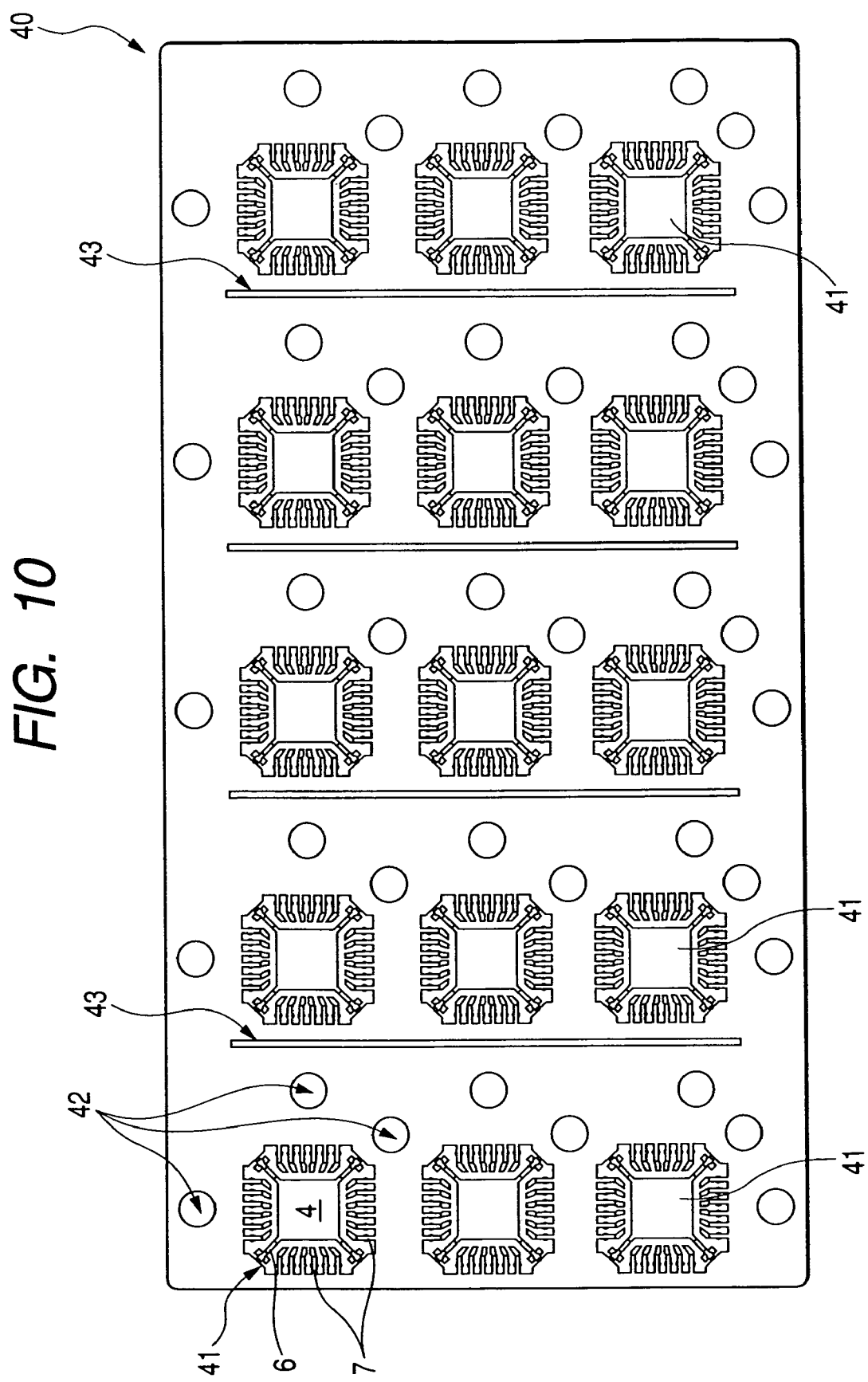
FIG. 10 is a plan view of a lead frame used in manufacturing the semiconductor device of the first embodiment.

First, such a lead frame 40 as shown in FIG. 10 is formed. FIG. 10 is a schematic plan view of a lead frame 40 of a matrix configuration used in manufacturing the QFN type semiconductor device 1 according to this first embodiment.

Though not specially limited, in the lead frame 40, as shown in FIG. 10, product-forming portions 41 each consisting of a unit lead pattern are arranged five rows in a longitudinal direction (X direction) of the lead frame 40 and three columns in a transverse direction (Y direction) of the lead frame so that fifteen semiconductor devices 1 can be manufactured from one lead frame 40. In this first embodiment, the product-forming portions 41 are spaced relatively wide from one another because the sealing body 2 is formed for each product-forming portion 41.

Guide holes 42 to be used for the conveyance and positioning of the lead frame 40 are formed in various positions of the lead frame. Thin slits 43 are formed each between adjacent rows so that heat distortion can be relieved.

For example, the lead frame 40 is formed by etching a 0.2 mm thick copper alloy plate or punching the same plate with a press into a desired pattern. According to the structure of the lead frame 40, as shown in FIG. 10, tab suspending leads 6 are projected respectively from the corners of a rectangular frame portion and support the corners of a square tab 4 positioned centrally of the frame portion. Further, plural leads 7 project from four inner sides of the frame portion. The structure of the tab suspending leads 6 and that of the leads 7 are as already described with reference to FIGS. 5 to 8 and therefore explanations thereof will here be omitted. Projecting portions 17 of the tab suspending leads 6 and fixed pieces 15 and wire connecting portions 11a of the leads 7 are formed by etching. Though not shown, a plating film is formed on each of the wire connecting surfaces of the tab suspending leads 6 and the leads 7. For example, the plating film is formed by Au, Ag, or Pd.

Figure 11:
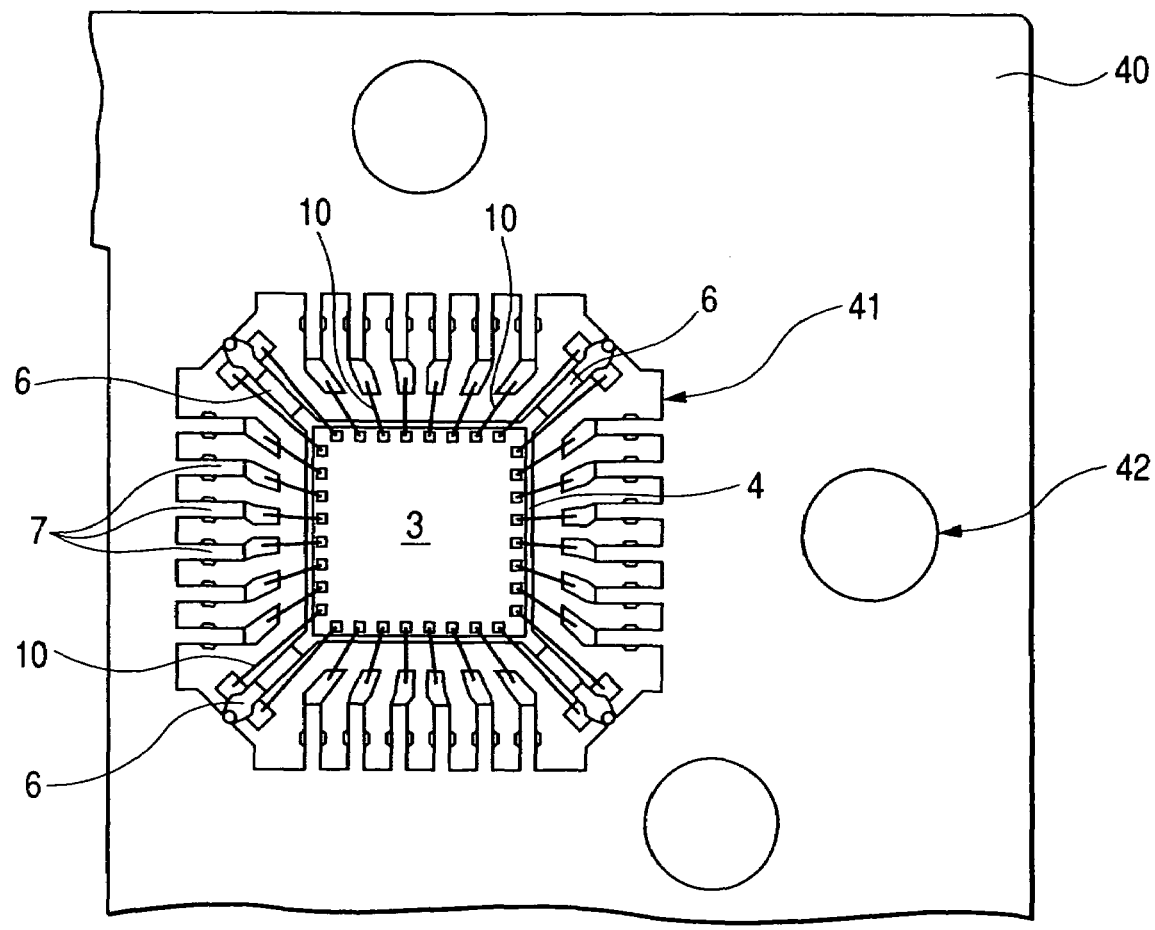
FIG. 11 is a plan view of a lead frame, showing a state in which a semiconductor chip is fixed onto a tab and electrodes of the semiconductor chip are connected with leads and tab suspending leads through wires in manufacturing the semiconductor device of the first embodiment.

Next, as shown in FIG. 11, a semiconductor chip 3 is fixed (mounted) onto one surface, e.g., second surface, of each product-forming portion 41 through an adhesive 5 (see FIGS. 3 and 4). Plural electrodes (electrode pads) 9 are formed on a main surface of the semiconductor chip 3 and a back electrode is formed on a back surface of the chip. The semiconductor chip 3 is connected to the tab 4 through the adhesive 5 so that the back electrode confronts the second surface of the tab 4. For example, Ag paste is used as the adhesive 5. Therefore, after connection of the semiconductor chip 3 to the tab 4, the Ag paste is cured by baking to fix the chip to the tab.

Then, as shown in FIG. 11, the electrodes 9 on the semiconductor chip 3 and wire connecting surfaces 11 of the leads 7 are connected together through electrically conductive wires 10. For example, the wires 10 are gold wires. At this time, the electrodes 9 as ground potential electrodes and the projecting portions 17 of the tab suspending leads 16 are connected together through the wires 10.

Figure 12:
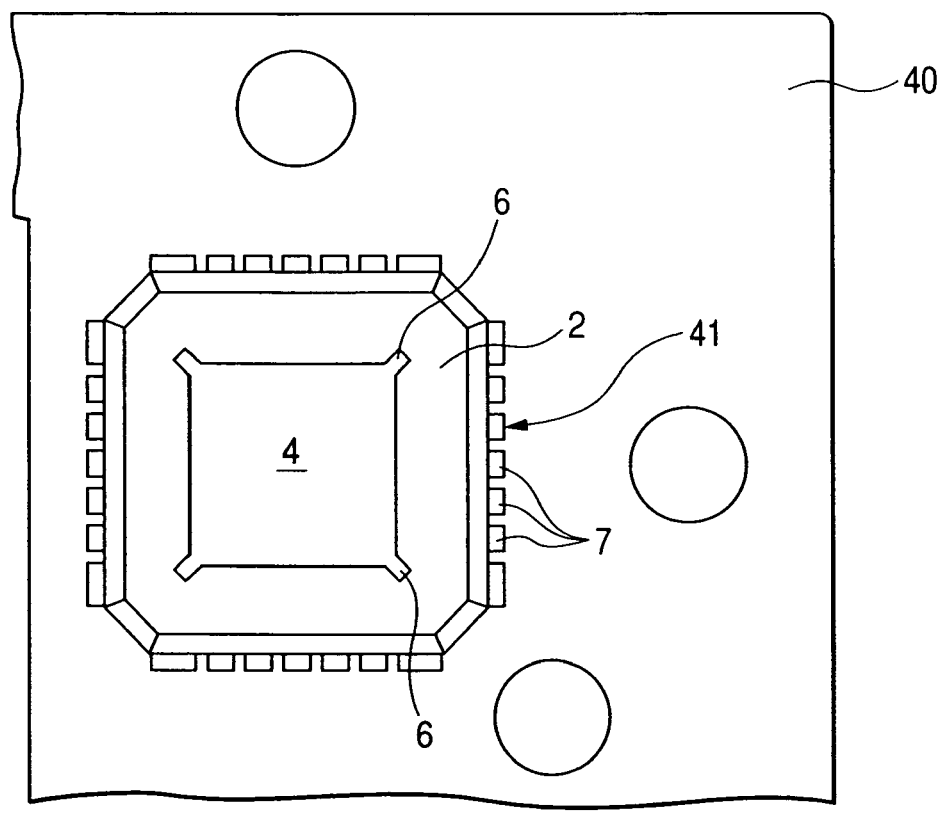
FIG. 12 is a plan view of the lead frame, showing a state in which portions of the leads and the tab suspending leads, as well as the semiconductor chip, wires and tab, are covered with the sealing body in manufacturing the semiconductor device of the first embodiment.

Next, the first surface side of the lead frame 40 is subjected to one-side molding by a conventional transfer molding method to form a sealing body 2 as shown in FIG. 12. In each product-forming portion 41, the semiconductor chip 3, wires 10, tab 4, tab suspending leads 6 and portions of the leads 7 are sealed with the sealing body 2.

Figure 13:
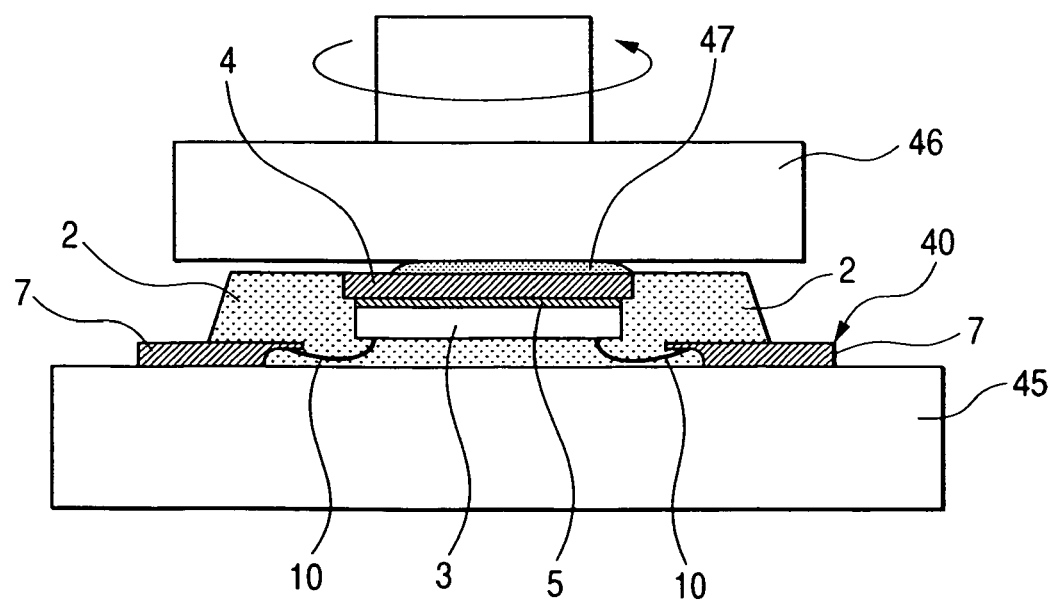
FIG. 13 is a schematic diagram showing a state in which resin adhered to the surface of the tab exposed to the lower surface of the sealing body is removed by polishing in manufacturing the semiconductor device of the first embodiment.

Then, as shown in FIG. 13, the lead frame 40 formed with the sealing body 2 is fixed onto a table 45 of a polishing apparatus and a grinder 46 is rotated to polish the surface of the tab 4 exposed to an upper surface of the sealing member 2 under the supply of abrasive and washing water. By this polishing operation it is possible to remove resin burr 47 formed by oozing out and adhering of the resin to the surface of the tab 4. As a result, the surface (upper surfaces) of the tab 4 exposed to upper surfaces of the slant faces 2a become clean and serve as an efficient heat dissipating surface.

As a method dispensing with the polishing process there may be adopted a transfer molding method wherein, at the time of forming the resin sealing body 2, a flexible sheet is used between an inner wall surface of a cavity in an upper die of a molding die and the tab 4. For example, a fluorine resin sheet is used as the flexible sheet, taking releasability from the molding die and the leakage of resin in transfer molding into account. The transfer molding using such a flexible sheet is generally called laminate molding or sheet molding.

Figure 2:
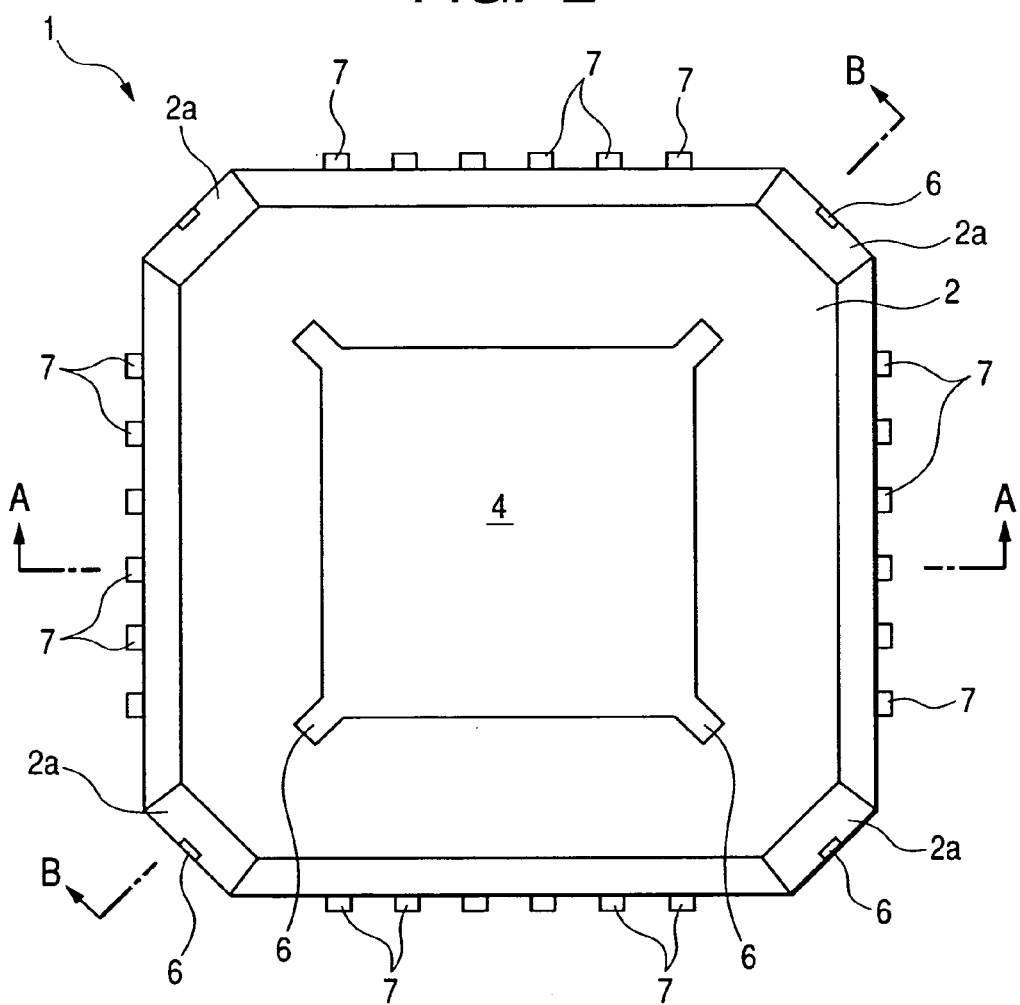
FIG. 2 is a plan view of the semiconductor device of the first embodiment.

Next, the leads 7 projecting from around the sealing body 2 and the tab suspending leads 6 projecting from the slant faces 2a of the sealing body 2 are cut to fabricate plural such semiconductor devices 1 as shown in FIGS. 2 to 4.

The following effects are obtained by this first embodiment.

(1) Since the projecting portions 17 formed on a side of the tab suspending leads 6 which are contiguous to the tab 4 set at ground potential and the ground potential electrodes 9 are connected together through wires 10, it is possible to reduce the number of leads 7 provided as ground potential leads and hence possible to attain the reduction in size of the semiconductor device 1.

(2) Since the projecting portions 17 formed on a side of the tab suspending leads 6 which are contiguous to the tab 4 set at ground potential and the ground potential electrodes 9 are connected together through wires 10 and the wires 10 are not connected to the tab portion deviated from the semiconductor chip 3, it is possible to attain the reduction in size of the tab 4 and hence of the semiconductor device 1.

(3) Although wire 10 is connected to the front end (inner end) of each lead 7, the wire connecting portion 11a is wide and projects on one side. This projecting portion bites into the resin which forms the sealing body and prevents the lead 7 from falling off from the sealing body 2. In each lead 7, moreover, since fixed pieces 15 are provided on both sides and a depression 16 is formed in the second surface of the lead, the fixed pieces 15 and the depression 16 bite into the resin which forms the sealing body 2, whereby the lead 7 is preventing from falling off from the sealing body 2. As a result, the reliability of the semiconductor device 1 is improved. Even if each lead 7 is formed straight and is merely provided with fixed pieces 15, it is possible to prevent dislodgment of the lead 7.

(4) Since the upper surface of the tab 4 with the semiconductor chip 3 fixed thereto is exposed to the upper surface of the sealing body 2, the heat dissipating member 35 can be attached to the tab 4 and it is possible to provide the semiconductor device 1 superior in heat dissipating performance.

(5) Since the resin adhered to the surface of the tab 4 which is exposed to the upper surface of the sealing body 2 is removed by polishing, there no longer exists any substance that resists the dissipation of heat, with consequent improvement of the heat dissipating performance.

Second Embodiment

Figure 14:
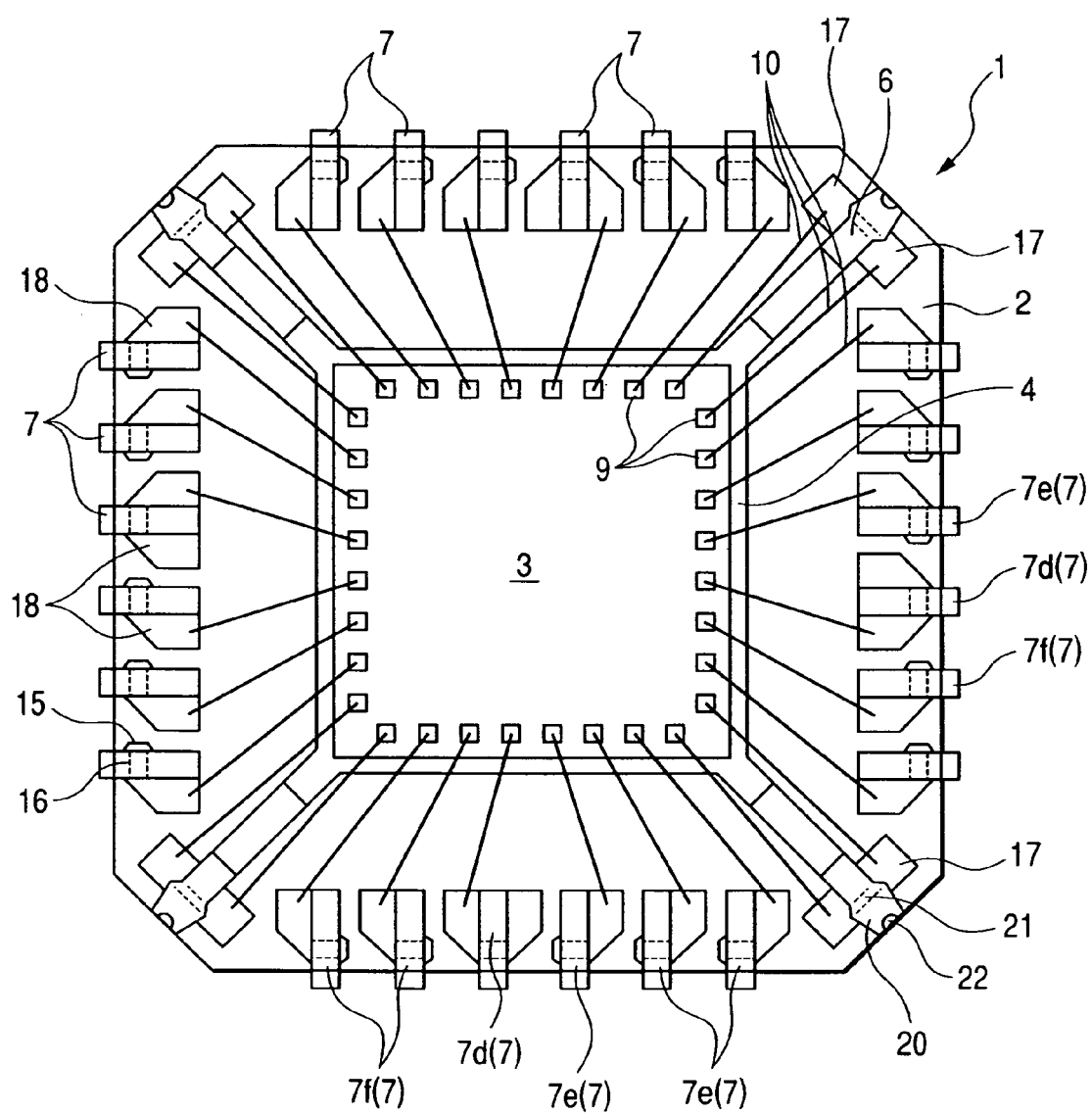
Figure 15A:
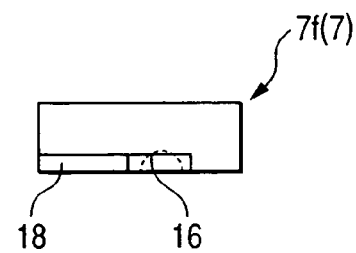
FIGS. 15(a), 15(b) and 15(c) are diagrams showing an inverted state of a single-wing lead portion having a wire-connecting projecting portion on one side in the semiconductor device of the second embodiment.
Figure 15B:
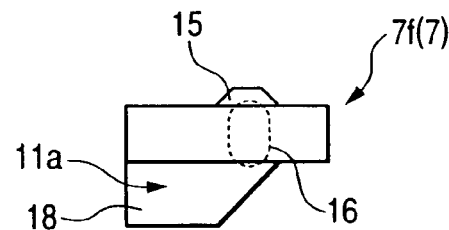
Figure 15C:
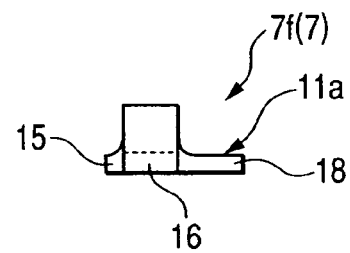
Figure 16A:
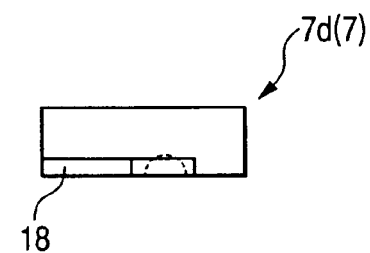
FIGS. 16(a), 16(b) and 16(c) are diagrams showing an inverted state of a double-wing lead portion having wire-connecting projecting portions on both sides in the semiconductor device of the second embodiment.
Figure 16B:
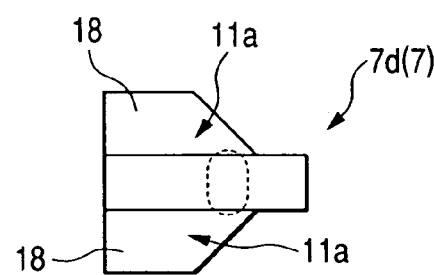
Figure 16C:
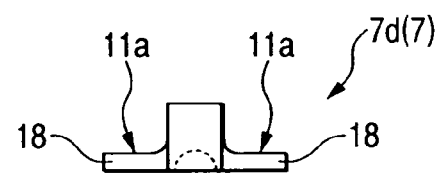

FIGS. 14 to 16 illustrate a semiconductor device according to a second embodiment of the present invention. According to the structure of the semiconductor device 1 of this second embodiment, in the semiconductor device 1 of the first embodiment, leads 7 are formed shorter and a thin projecting portion 18 as a wire connecting portion is formed on one or both sides of each lead 7.

FIG. 14 is a schematic bottom view of the semiconductor device, showing a state in which leads, wires and a semiconductor chip are seen through from the bottom side. FIGS. 15 and 16 show a lead 7 in an inverted state, i.e., a state in which the second surface is an upper surface. FIGS. 15(a), 15(b) and 15(c) show a lead 7 provided on one side with a projecting portion 18, of which FIG. 15(a) is a front view thereof, FIG. 15(b) is a plan view thereof, and FIG. 15(c) is a side view thereof.

Among leads 7 arranged on the four sides of a sealing body 2, leads 7 positioned nearly centrally of the four sides respectively are each of a structure wherein projecting portions 18 are formed on both sides of the lead as shown in FIG. 16, while the other leads 7 are each of a structure wherein a projecting portion 18 is formed on either the right or the left side of the lead. The lead pitch is the same as that in the semiconductor device 1 of the first embodiment. If projecting portions 18 are formed on both sides of all the leads 7, a contact of adjacent leads will result.

Thus, as shown in FIG. 14, the central leads 7 are each provided with projecting portions 18 formed on both right and left sides, i.e., the central leads 7 are double-wing leads 7d. The leads arranged on the right side of each double-wing lead 7d are single-wing leads 7e each having a-projecting portion 18 on only the right side thereof, while the leads arranged on the left side of each double-wing lead 7d are single-wing leads 7f each having a projecting portion 18 on only the left side thereof.

FIG. 16 shows the double-wing lead 7d and FIG. 15 shows the single-wing lead 7f. Each projecting portion 18 is formed from an inner end face of the associated lead 7 to an intermediate portion of the lead. The projecting portion 18 is formed by the same method as the method for forming the projecting portions 17 in each tab suspending lead 6 described in the previous first embodiment. That is, the projecting portion 18 is formed by etching in forming the lead frame. The etched surface serves as the wire connecting surface 11.

As is the case with the leads 7 described in the first embodiment, in each single-wing lead, as shown in FIG. 15, a fixed piece 15 is provided on the side face free of the projecting portion 18 and a depression 16 is formed in the second surface, and as shown in FIG. 16, a depression 16 is formed in the second surface of the double-wing lead 7d.

In this second embodiment, the same effects as in the first embodiment can be obtained. Besides, since the lead length is shorter than in the semiconductor device 1 of the first embodiment, the leads 7 can be approximated to the tab 4 and the reduction of cost and the improvement of the heat dissipating performance can be attained by the reduction in size of the semiconductor device 1 and the reduction of wire length.

Third Embodiment

FIGS. 17 to 23 illustrate a semiconductor device according to a third embodiment of the present invention. The semiconductor device 1 of this third embodiment is of a structure wherein, in the semiconductor device 1 of the second embodiment, all the leads 7 are made double-wing leads 7d and projecting portions 18 are displaced in the lead extending direction so as not to contact each other between adjacent leads.

Figure 17:
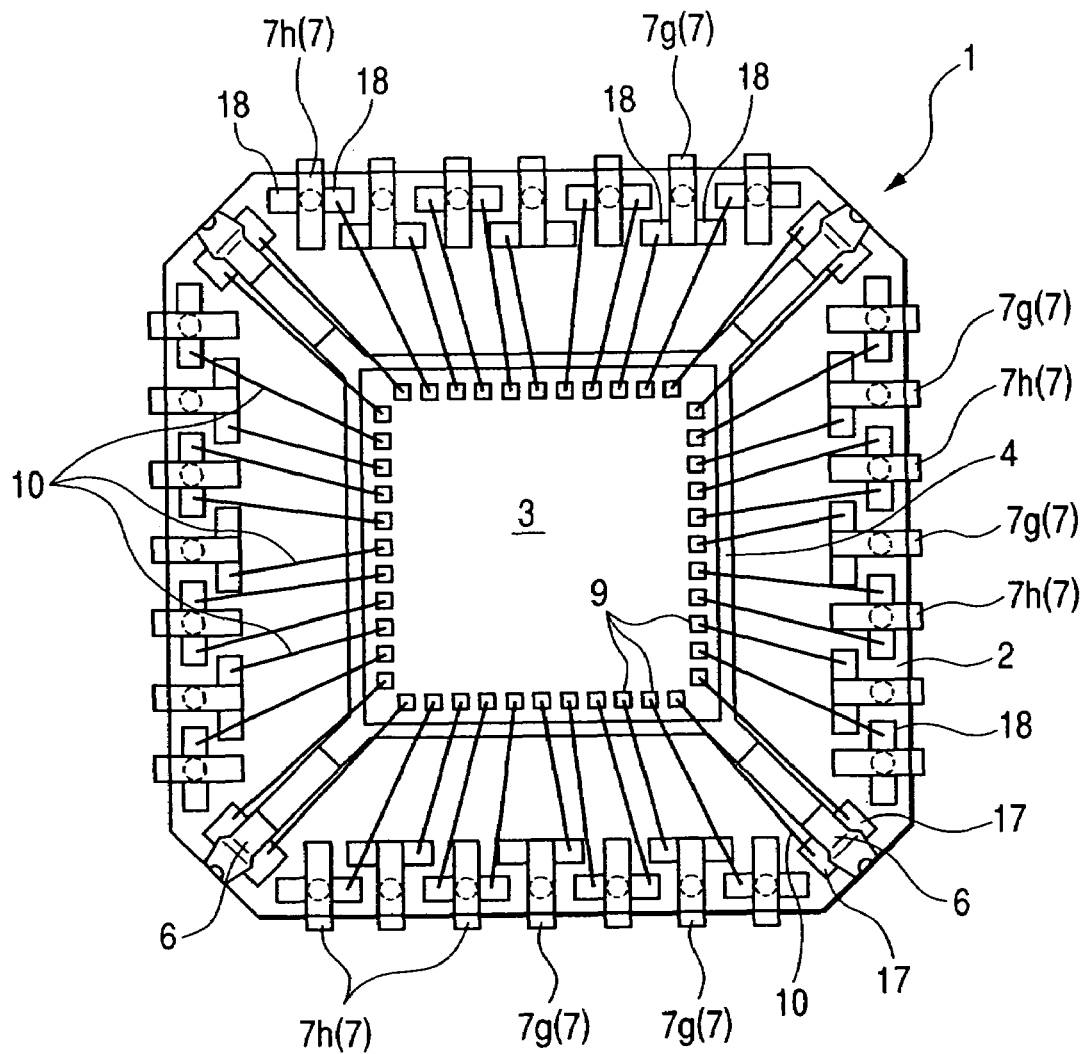
Figure 20A:
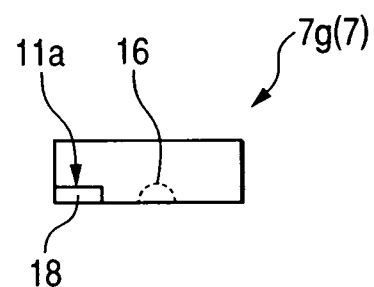
FIGS. 20(a), 20(b) and 20(c) are diagrams showing an inverted state of the inner-wing lead in the semiconductor device of the third embodiment.
Figure 20B:
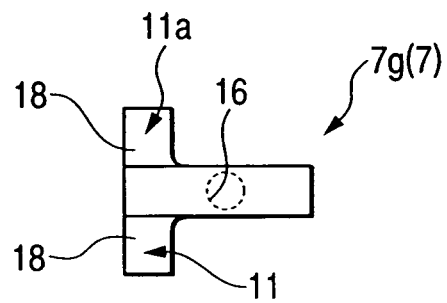
Figure 20C:
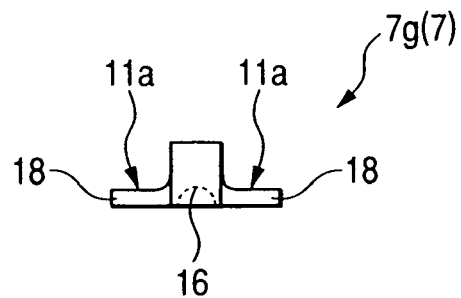
Figure 22A:
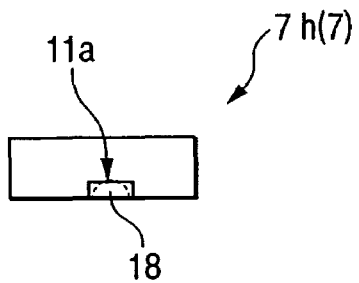
FIGS. 22(a), 22(b) and 22(c) are diagrams showing an inverted state of the middle-wing lead in the semiconductor device of the third embodiment.
Figure 22B:
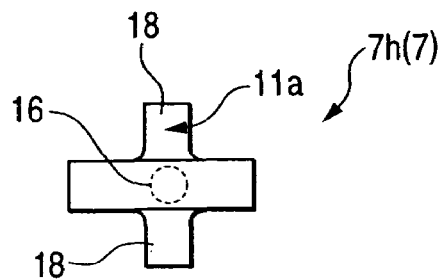
Figure 22C:
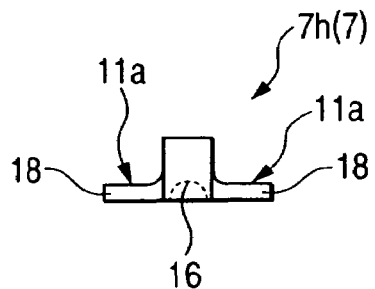

One type of lead 7 has such a structure as shown in FIGS. 20(a) to 20(c) wherein quadrangular projections 18 are formed on both sides of an inner end portion of the lead 7 (inner-wing lead 7g), while the other type of lead 7 has such a structure as shown in FIGS. 22(a) to 22(c) wherein projecting portions 18 are formed on both sides of a middle portion of the lead (middle-wing lead 7h). The semiconductor device 1 of this third embodiment has such a structure as shown in FIG. 17 wherein inner-wing leads 7g and middle-wing leads 7h are arranged alternately on the four sides of the sealing body 2. Since the projecting portions 18 of the middle-wing leads 7h and the projecting portions 18 of the inner-wing leads 7g are displaced from each other in the lead extending directions, both never come into contact with each other. In FIGS. 20(a) to 20(c) and 22(a) to 22(c), surfaces formed by etching serve as wire connecting surfaces 11. In each of the inner-wing leads 7a and middle-wing leads 7h, a depression 16 is formed in the second main surface.

Figure 18:
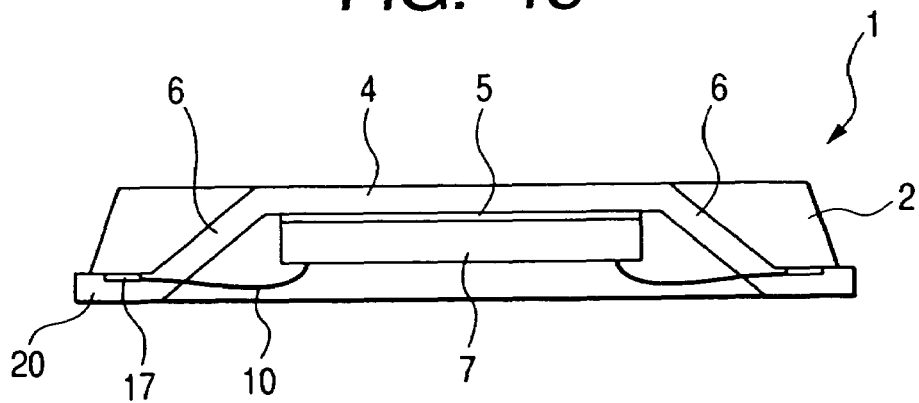
FIG. 18 is a schematic sectional view of the semiconductor device of the third embodiment as seen in an extending direction of a tab suspending lead.
Figure 19:
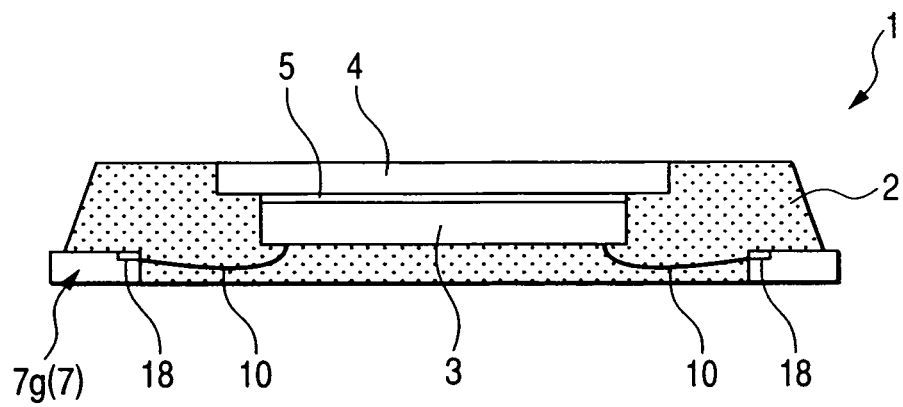
FIG. 19 is a schematic sectional view showing a state of wire connection in an inner-wing lead having wire-connecting projecting portions on an inner end side thereof and on both sides of the inner end in the semiconductor device of the third embodiment.
Figure 21:
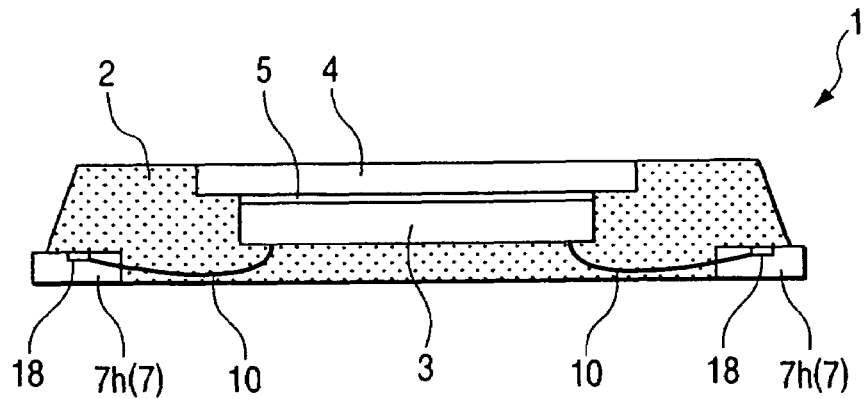
FIG. 21 is a schematic sectional view showing a state of wire connection in a middle-wing lead having wire-connecting projecting portions at a middle position thereof and on both sides of the middle position in the semiconductor device of the third embodiment.

Electrodes 9 on the semiconductor chip 3 are connected to the tab suspending leads 6 and leads 7 through wires 10. FIG. 18 shows a state in which projecting portions 17 of the tab suspending leads 6 and the semiconductor chip 3 are connected together through wires 10. FIG. 19 shows a state of connection of wires 10 which connect the semiconductor chip 3 and the projecting portions 18 of the inner-wing leads 7g with each other. FIG. 21 shows a state of connection of wires 10 which connect the semiconductor chip 3 and the projecting portions 18 of the middle-wing leads 7h with each other.

Figure 23:
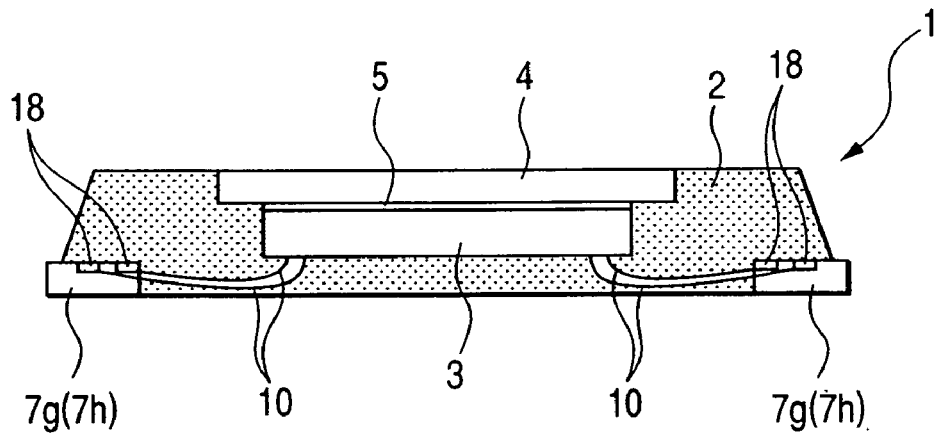
FIG. 23 is a schematic diagram showing a difference in wire loop height between the inner-wing lead and the middle-wing lead in the semiconductor device of the third embodiment.

In manufacturing the semiconductor device 1 of this third embodiment, the projecting portions 18 of adjacent leads 7 are displaced from each other in the lead extending direction so as not to be arranged in a row in the direction intersecting the leads 7. According to this arrangement, at the time of connecting the projecting portions 18 of adjacent leads with the electrodes 9 on the semiconductor chip by wire bonding, the height of a loop described by wire 10 in one lead and that in the other lead can be made different from each other. The wires 10 in adjacent leads extend without mutual contact, as shown in FIGS. 17 and 23. FIG. 23 is a schematic diagram in which both inner-wing lead 7g and middle-wing lead 7h are shown to indicate a difference in shape and loop height of wires 10 in both leads.

According to this third embodiment the following effects can be obtained in addition to the effects obtained in the first and second embodiments. Since the number of wire connecting portions of each lead 7 becomes larger, it is possible to cope with a more complicated wiring layout. Even in the case where all of the ground potential electrodes on the semiconductor chip cannot be connected to the tab suspending leads 6 and some leads are made ground leads, the number of such ground leads can be reduced because the number of wire connecting portions of each lead becomes larger, and hence it is possible to reduce the size of the semiconductor device 1.

Fourth Embodiment

Figure 24:
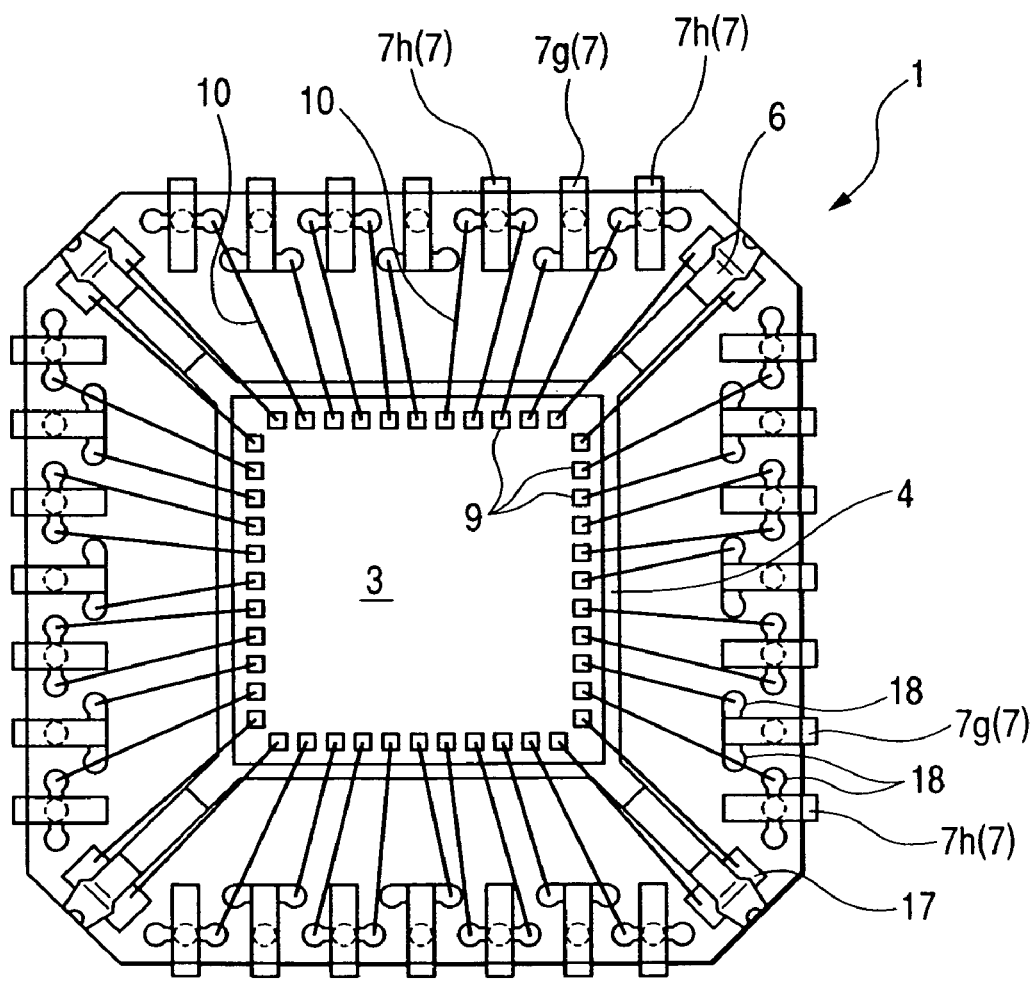
Figure 25A:
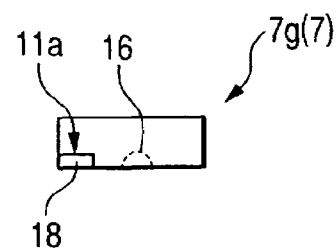
FIGS. 25(a), 25(b) and 25(c) are diagrams showing an inverted state of an inner-wing lead having wire-connecting portions on an inner end side and on both sides of the inner end in the semiconductor device of the fourth embodiment.
Figure 25B:
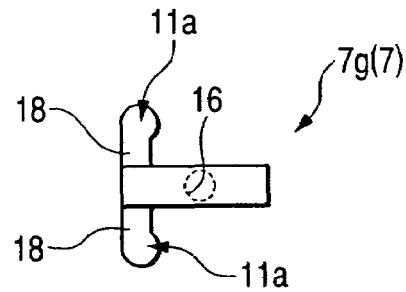
Figure 25C:
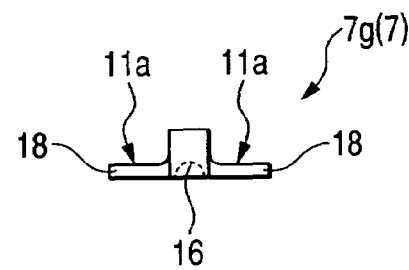
Figure 26A:
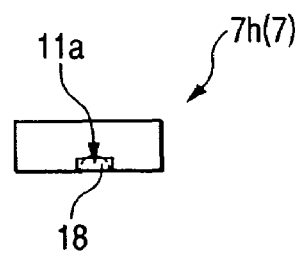
FIGS. 26(a), 26(b) and 26(c) are diagrams showing an inverted state of a middle-wing lead having wire-connecting projecting portions at a middle position thereof and on both sides of the middle position.
Figure 26B:
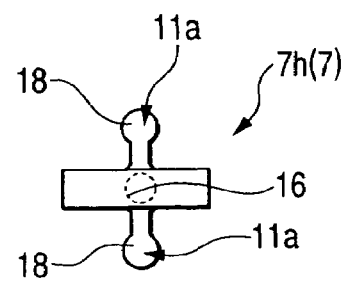
Figure 26C:
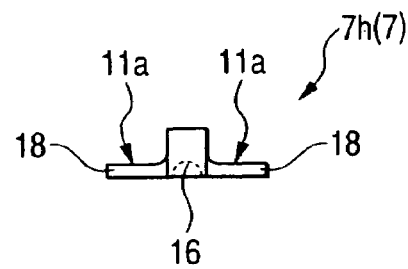

FIGS. 24 to 26 illustrate a semiconductor device according to a fourth embodiment of the present invention, of which FIG. 24 is a schematic bottom view showing a state in which leads, wires and a semiconductor chip are seen through, FIG. 25 shows an inverted state of an inner-wing lead having projecting portions on an inner end side thereof, and FIG. 26 shows an inverted state of a middle-wing lead having projecting portions at middle positions thereof.

According to this fourth embodiment, a planar shape of the projecting portions 18 of each lead in the semiconductor device 1 of the third embodiment is changed. As shown in FIGS. 25(a), 25(b), 25(c) and FIGS. 26(a), 26(b), 26(c), projecting portions 18 of inner-wing and middle-wing leads 7g, 7h are each formed so as to be narrow at the base portion and become thicker toward the tip end. For example, the tip end of each projecting portion 18 is circular in shape.

By thus narrowing the base portion of each projecting portion 18, the projecting portion 18 bites more firmly into the resin which forms the sealing body 2, so that the leads 7 become difficult to fall off from the sealing body 2.

Figure 35:
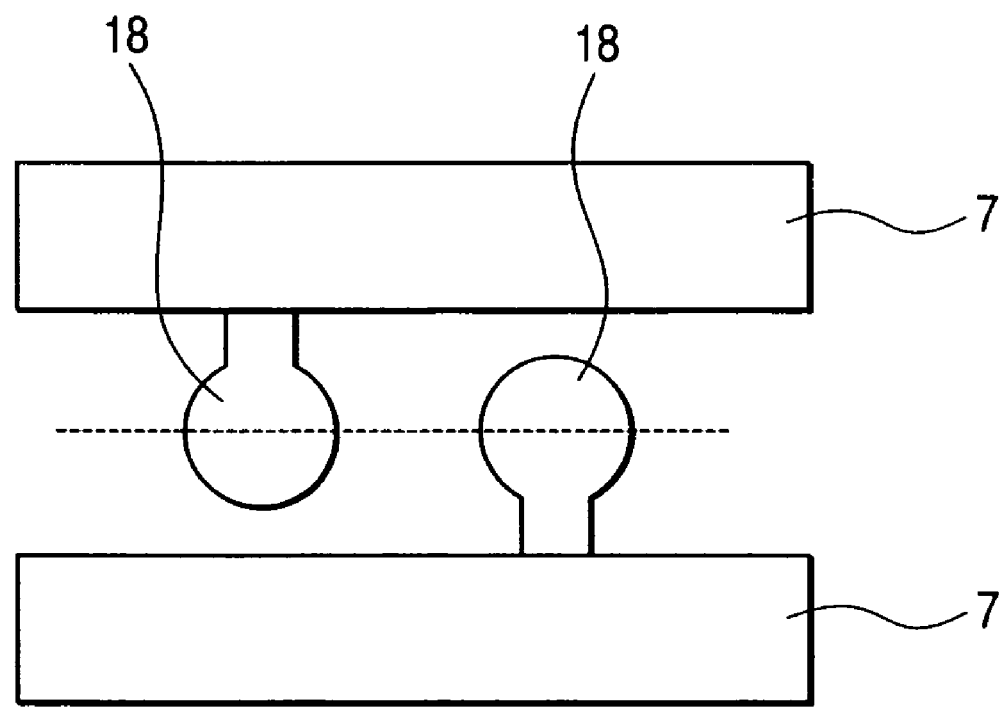
FIG. 35 is a schematic plan view showing two adjacent leads 7 in a semiconductor device according to a modification of the fourth embodiment.

FIG. 35 is a schematic diagram showing two adjacent leads 7 according to a modification of the fourth embodiment. In this modification, the projecting portions 18 of adjacent leads 7 may overlap each other in a direction perpendicular to an extending direction of a broken line, as shown in FIG. 35. In this case, the pitch between adjacent leads 7 can be made narrower by an amount corresponding to the amount of overlap of adjacent protecting portions 18.

Fifth Embodiment

Figure 31A:
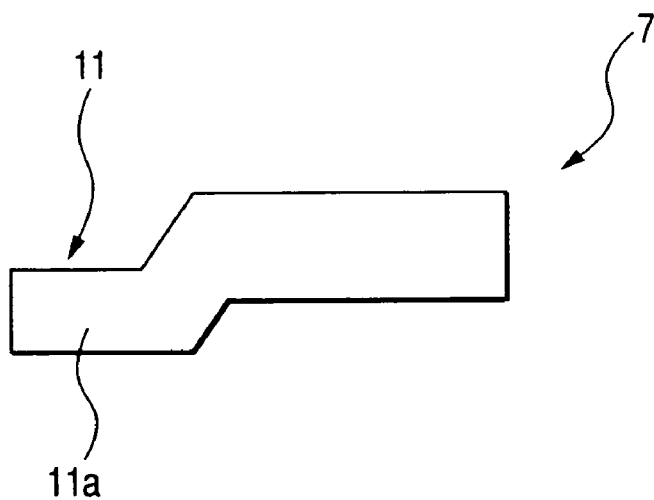
FIG. 31(a), 31(b) and 31(c) are diagrams showing an inverted state of the wire-connecting inner end of the lead in the semiconductor device of the fifth embodiment.
Figure 31B:
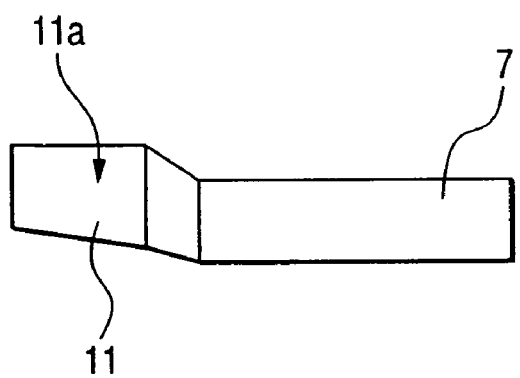
Figure 31C:
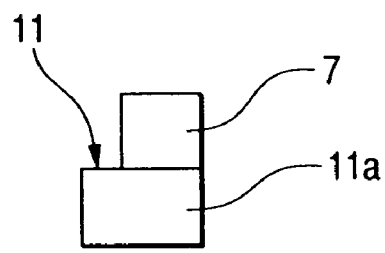
Figure 32:
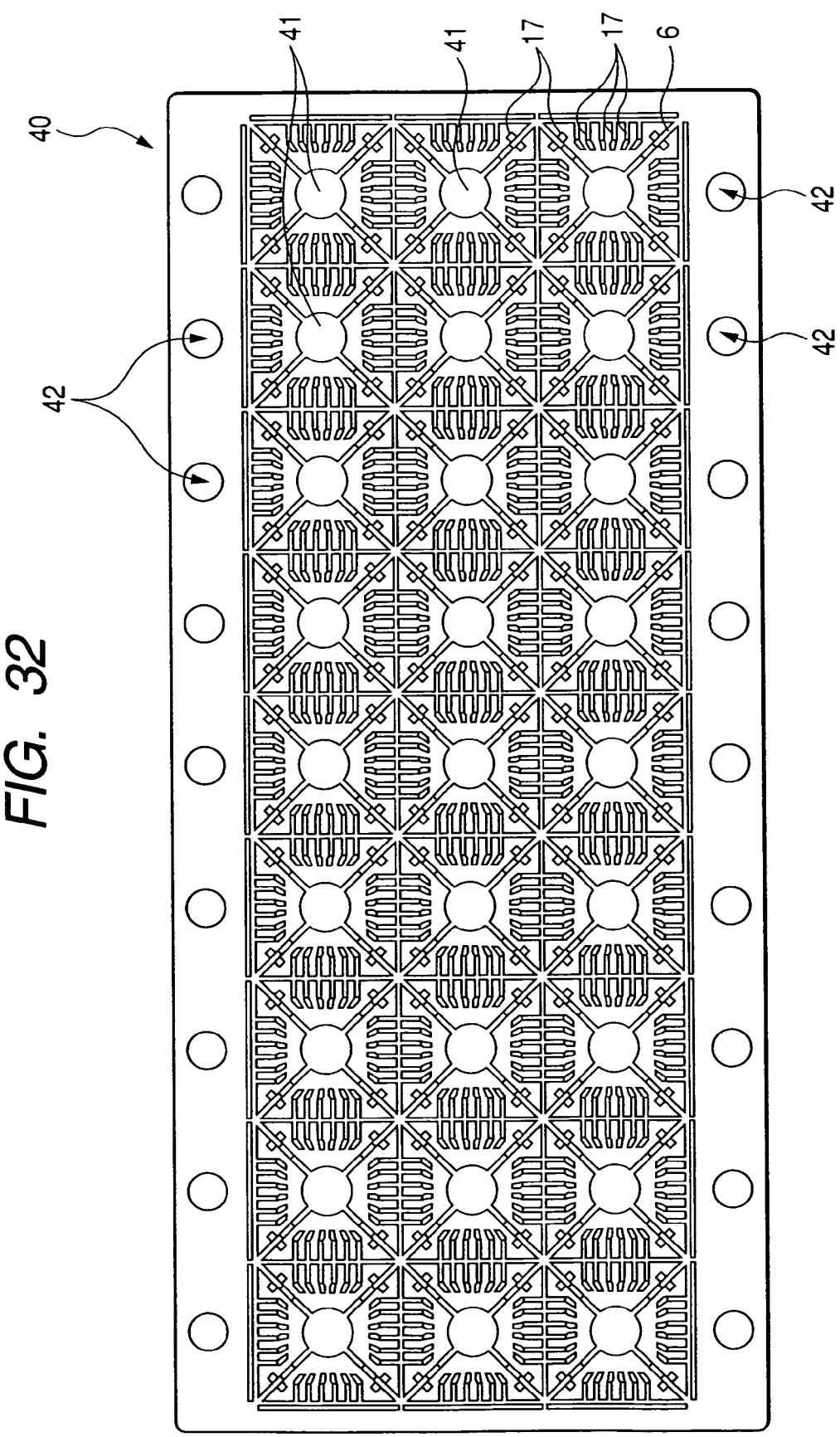
FIG. 32 is a plan view of a lead frame used in manufacturing the semiconductor device of the fifth embodiment.

FIGS. 27 to 34 illustrate a semiconductor device according to a fifth embodiment of the present invention. In this fifth embodiment, such a lead frame 40 as shown in FIG. 32 is used in manufacturing the semiconductor device 1. In the lead frame 40, product-forming portions 41 each capable of affording the semiconductor device 1 are arranged in nine rows in a longitudinal direction of the lead frame 40 and in three columns in a transverse direction of the lead frame, so that a total of twenty-seven semiconductor devices 1 can be manufactured from one lead frame 40.

Figure 27:
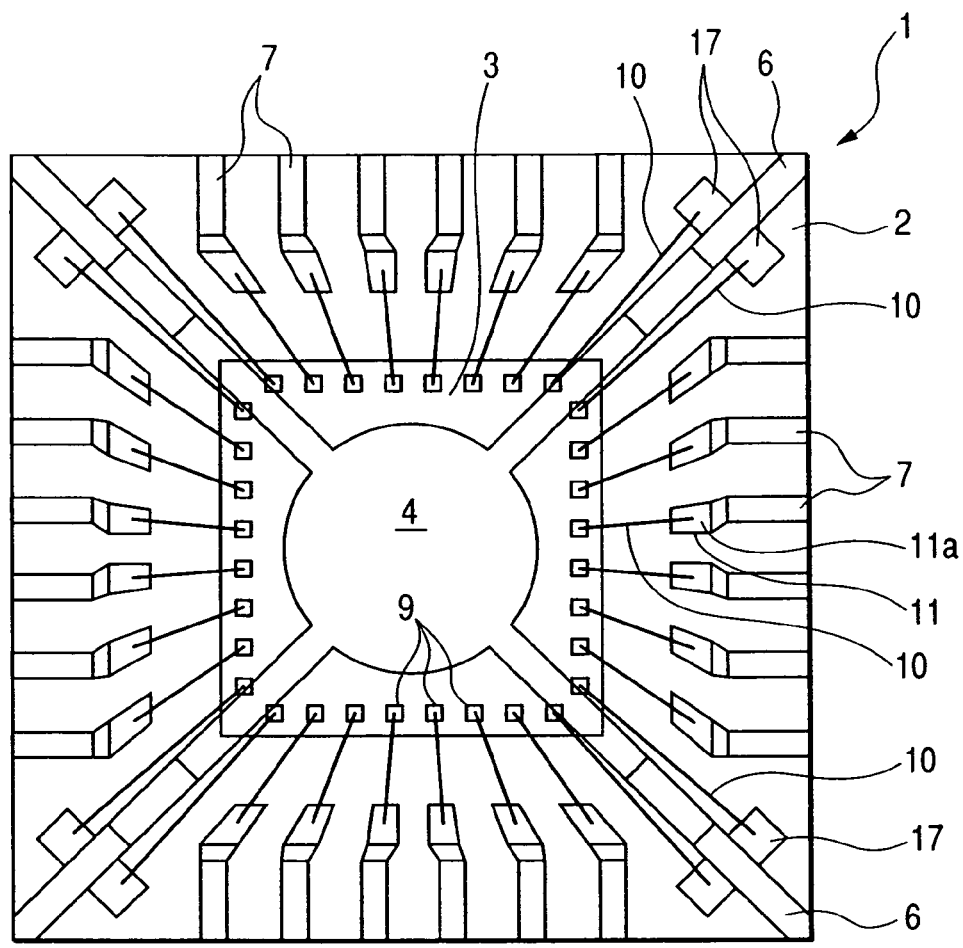

In the lead frame 40 used in this fifth embodiment, a frame is used in common to both a frame of a product-forming portion 41 and a frame of a product-forming portion 41 adjacent thereto. Consequently, by forming a resin layer on one surface of the lead frame 40 after the end of chip bonding and wire bonding and by cutting both the lead frame 40 and the resin layer at a time, it is possible to fabricate such a square semiconductor device 1 as shown in FIG. 27.

The cutting is carried out using a dicing blade of a predetermined thickness. By this cutting work, the frame portion which is thin is cut and vanishes and end faces of the leads 7 and the tab suspending leads 6 are exposed to the cut surface. In the cutting work, a support tape is affixed to the surface of the resin layer, then cutting is performed up to an intermediate depth position of the support tape to cut the lead frame 40 and the resin layer. Thereafter, the support tape is removed to afford the semiconductor device 1.

Though not shown, a plating film is formed on the wire connecting surface of the lead frame 40 in order to improve the wire connectability. For example, the plating film is formed by Au, Ag, or Pd.

Figure 28:
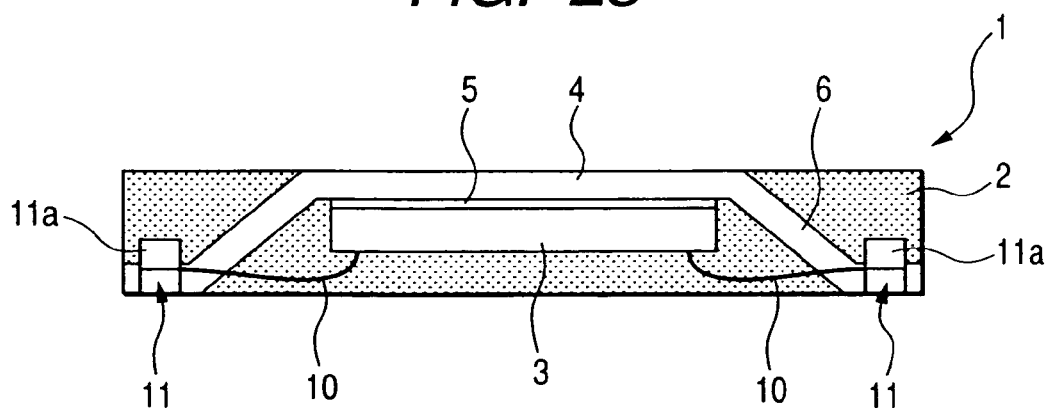
FIG. 28 is a schematic sectional view of the semiconductor device of the fifth embodiment as seen in an extending direction of a tab suspending lead.
Figure 29A:
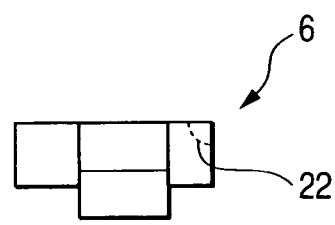
FIGS. 29(a), 29(b) and 29(c) are diagrams showing an inverted state of the tab suspending lead having wire-connecting portions on both sides thereof.
Figure 29B:
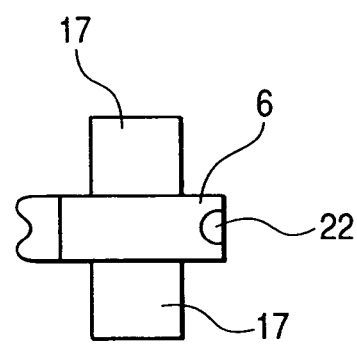
Figure 29C:
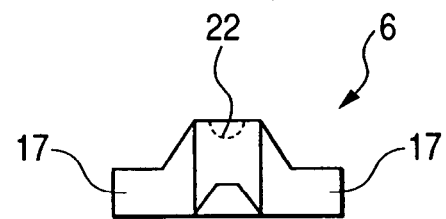

The semiconductor device 1 of this fifth embodiment is different from the semiconductor device 1 of the first embodiment in that the tab 4 used therein is smaller than the semiconductor chip 3 and is circular. In this fifth embodiment, moreover, projecting portions 17 of each tab suspending lead 6 and a bent and wide wire connecting portion 11a at a front end of each lead 7 are bent with a press. This point is also different from the first embodiment. FIG. 28 is a schematic sectional view of the semiconductor device 1 taken in the extending direction of tab suspending leads 6 and FIGS. 29(a) to 29(c) show an inverted state of a tab suspending lead provided on both sides thereof with projecting portions 17 formed by bending with a press, of which FIG. 29(a) is a front view, FIG. 29(b) is a plan view, and FIG. 29(c) is a side view.

Figure 30:
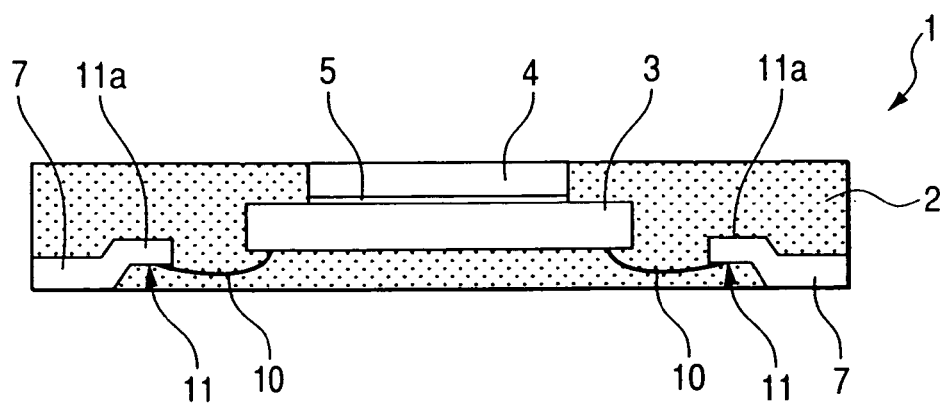
FIG. 30 is a schematic sectional view showing a connected state of wire to an inner end of a lead in the semiconductor device of the fifth embodiment.

FIG. 30 is a schematic sectional view of the semiconductor device taken in the extending direction of leads 7 and FIGS. 31(a) to 31(c) show an inverted state of a lead 7 provided on an inner end side with a wire connecting portion 11a formed by bending with a press, of which FIG. 31(a) is a front view, FIG. 31(b) is a plan view and FIG. 31(c) is a side view.

In case of thus stepping each wire connecting surface with respect to the second surfaces of the leads and tab suspending leads, there may be adopted, other than etching, a bending method using a press. The bending method using a press is suitable for mass production and permits reduction of the manufacturing cost.

FIGS. 33 and 34 show a modification of the fifth embodiment, in which projecting portions 17 of a tab suspending lead 6 are formed by coining. More specifically, projecting portions are formed on both side faces of a tab suspending lead 6 at a position corresponding to a corner portion of the sealing body 2 and are then crushed with a press to form projecting portions 17 shown in FIG. 34. FIGS. 34(*a*), 34(*b*) and 34(*c*) show an inverted state of the tab suspending lead 6, of which FIG. 34(*a*) is a front view, FIG. 34(*b*) is a plan view, and FIG. 34(*c*) is a side view.

Also in this modification the projecting portions 17 of each tab suspending lead 6 can be formed with a press and therefore it is possible to reduce the manufacturing cost.

The shape of the tab 4 is not limited to the circular shape, but may be quadrangular or crossed insofar as the shape adopted is smaller than the area of the chip.

Although the present invention has been described above concretely by way of embodiments thereof, it goes without saying that the present invention is not limited to the above embodiments, but that various changes may be made within the scope not departing from the gist of the invention. For example, although a QFN with a single row arrangement of terminals is used as a model in the semiconductor devices of the above embodiments, the same effects as above are obtained also in the case of a QFN (LLGA: Leadframe Land Grid Array) having plural rows of external terminals.

What is claimed is:

1. A method of manufacturing a semiconductor device, comprising the steps of:
   forming a lead frame, the lead frame comprising a plurality of leads, a tab for fixing a semiconductor chip, a plurality of tab suspending leads contiguous to the tab and each having a projecting portion projecting from a side face thereof, and a frame portion for connecting the leads and the tab suspending leads with one another, the leads, the tab, the tab suspending leads and the frame portion each having a first surface and a second surface opposite to the first surface, the leads and the projecting portions having wire connecting surfaces at least partially on the second surface, the wire connecting surfaces being positioned closer to the first surface side than the other portion;
   fixing a semiconductor element to the second surface of the tab;
   electrically connecting electrodes of the semiconductor element with the wire connecting surfaces of the leads and of the projecting portions on the second surface side through electrically conductive wires;
   sealing the semiconductor element, the wires, the leads, the tab suspending leads and the projecting portions of the tab suspending leads with an insulating resin so that the second surfaces of the leads and the tab suspending leads are exposed from the insulating resin, to form a sealing body; and
   cutting off the leads and the tab suspending leads from the frame portion.

2. A method according to claim 1, wherein:
   in the step of forming the lead frame, the lead frame is formed so as to include product-forming portions arranged orderly in both longitudinal and transverse directions, the product-forming portions each including the leads, the tab, the tab suspending leads, the projecting portions and the frame portion;
   in the step of forming the sealing body, the product-forming portions are each covered with the insulating resin to form a resin layer; and
   in the step of cutting off the leads and the tab suspending leads, the lead frame is cut in both longitudinal and transverse directions along edges of the product-forming portions and together with the resin layer to form a plurality of semiconductor devices.

3. A method according to claim 1, wherein, in the step of forming the lead frame, the second surface of the lead frame is etched a predetermined thickness to thin the lead portions and the projecting portions to which the wires are connected.

4. A method according to claim 1, wherein, in the step of forming the lead frame, the lead frame is subjected to coining with a press from the second surface side to thin the lead portions and the projecting portions to which the wires are connected.

5. A method according to claim 1, wherein, in the step of forming the lead frame, the lead frame is bent with a press from the second surface side to the first surface side to form the lead portions and the projecting portions to which the wires are connected.

6. A method according to claim 1, wherein, in the step of forming the lead frame, a projecting portion for wire connection is formed over a side face of each of the leads and a wire connecting surface as the second surface of the projecting portion is formed as a retracted surface with respect to the second surface of the lead.

7. A method according to claim 6, wherein the projecting portion is formed over a side face of an inner end portion of the lead.

8. A method according to claim 7, wherein the projecting portion is formed over both side faces of the lead.

9. A method according to claim 6, wherein the projecting portions of adjacent said leads are displaced from each other in the extending direction of the leads so as not to be arranged in one row in a direction intersecting the leads.

10. A method according to claim 1, wherein the projecting portions are formed so as to be narrow at their base portions in the leads and the tab suspending leads and thick at their tip end.

11. A method according to claim 1, wherein the tab suspending leads are bent halfway so that an upper surface of the tab is exposed to an upper surface of the sealing body, and after formation of the sealing body, the upper surface of the tab exposed to the upper surface of the sealing body is subjected to a treatment for the removal of resin adhered to the upper surface of the tab.

12. A method according to claim 8, wherein the projecting portions of adjacent said leads are displaced from each other in the extending direction of the leads so as not to be arranged in one row in a direction intersecting the leads.

13. A method according to claim 6, wherein the projecting portions are formed so as to be narrow at their base portions in the leads and the tab suspending leads and thick at their tip end.

* * * * *